(12) United States Patent
Seong et al.

(10) Patent No.: US 11,776,583 B2
(45) Date of Patent: Oct. 3, 2023

(54) SEMICONDUCTOR MEMORY DEVICES

(71) Applicant: Samsung Electronics Co., Ltd., Suwon-si (KR)

(72) Inventors: Hyejin Seong, Suwon-si (KR); Jisuk Park, Seoul (KR); Sungho Choi, Seoul (KR)

(73) Assignee: Samsung Electronics Co., Ltd.

( * ) Notice: Subject to any disclaimer, the term of this patent is extended or adjusted under 35 U.S.C. 154(b) by 651 days.

(21) Appl. No.: 16/876,023

(22) Filed: May 16, 2020

(65) Prior Publication Data

US 2021/0118473 A1 Apr. 22, 2021

(30) Foreign Application Priority Data

Oct. 21, 2019 (KR) .................. 10-2019-0130820

(51) Int. Cl.
*G11C 5/06* (2006.01)
*G11C 5/02* (2006.01)
*H01L 23/528* (2006.01)
*H10B 12/00* (2023.01)

(52) U.S. Cl.
CPC ............ *G11C 5/063* (2013.01); *G11C 5/025* (2013.01); *H01L 23/528* (2013.01); *H10B 12/0335* (2023.02); *H10B 12/315* (2023.02); *H10B 12/482* (2023.02); *H10B 12/485* (2023.02); *H10B 12/488* (2023.02)

(58) Field of Classification Search
CPC ......... H01L 27/10888; H01L 27/10814; G11C 5/063; G11C 5/025; H10B 12/03; H10B 12/0335; H10B 12/485; H10B 12/482; H10B 12/315

USPC ............ 365/63; 438/129, 279; 257/206, 390
See application file for complete search history.

(56) References Cited

U.S. PATENT DOCUMENTS

| | | | |
|---|---|---|---|
| 8,093,724 B2 | 1/2012 | Hasunuma | |
| 9,012,983 B2 | 4/2015 | Mine | |
| 9,236,387 B2 | 1/2016 | Oyu et al. | |
| 9,269,720 B1* | 2/2016 | Bae | H01L 21/31053 |
| 9,305,924 B2 | 4/2016 | Mikasa | |
| 9,419,000 B2* | 8/2016 | Kim | H01L 27/10891 |
| 9,431,324 B2* | 8/2016 | Shin | H01L 27/10885 |
| 9,575,224 B2 | 2/2017 | Freimann et al. | |

(Continued)

FOREIGN PATENT DOCUMENTS

| | | |
|---|---|---|
| JP | 2014175316 A | 9/2014 |
| JP | 5694625 B2 | 4/2015 |
| JP | 5748195 B2 | 7/2015 |

*Primary Examiner* — Jose R Diaz
(74) *Attorney, Agent, or Firm* — Fish & Richardson P.C.

(57) ABSTRACT

A semiconductor memory device includes a plurality of bit line structures including bit lines extending in parallel in a first lateral direction on a substrate, and a plurality of buried contacts and a plurality of landing pads. The plurality of buried contacts fill lower portions of spaces between the plurality of bit line structures on the substrate, and the plurality of landing pads fill upper portions of the spaces between the plurality of bit line structures and extend on the plurality of bit line structures. The plurality of landing pads have a hexagonal array structure, and central points of respective top surfaces of a first landing pad, a second landing pad, and a third landing pad, which are adjacent to each other from among the plurality of landing pads, are connected by a scalene triangle.

20 Claims, 34 Drawing Sheets

(56) References Cited

U.S. PATENT DOCUMENTS

| | | | |
|---|---|---|---|
| 10,134,606 B2 | 11/2018 | Woo et al. | |
| 10,373,961 B2* | 8/2019 | Yoon | H01L 27/10814 |
| 10,580,876 B2* | 3/2020 | Ahn | H01L 21/76897 |
| 11,121,134 B2* | 9/2021 | Lee | H01L 27/10814 |
| 11,183,500 B2* | 11/2021 | Song | H01L 27/10876 |
| 11,189,570 B2* | 11/2021 | Kim | H01L 27/10855 |
| 11,411,010 B2* | 8/2022 | Seong | H01L 27/10888 |
| 2006/0211192 A1 | 9/2006 | Cho et al. | |
| 2015/0061134 A1* | 3/2015 | Lee | H10B 12/34 |
| | | | 257/751 |
| 2015/0132943 A1 | 5/2015 | Kim et al. | |
| 2018/0047732 A1* | 2/2018 | Kim | H10B 12/0335 |
| 2018/0166450 A1* | 6/2018 | Kim | H10B 12/315 |
| 2019/0131307 A1 | 5/2019 | Kim et al. | |

* cited by examiner

SEMICONDUCTOR MEMORY DEVICES

CROSS-REFERENCE TO RELATED APPLICATION

This application claims the benefit of Korean Patent Application No. 10-2019-0130820, filed on Oct. 21, 2019, in the Korean Intellectual Property Office, the disclosure of which is incorporated herein in its entirety by reference.

BACKGROUND

The inventive concept relates to a semiconductor memory device, and more particularly, to a semiconductor memory device having landing pads configured to electrically connect active regions to lower electrodes.

In accordance with the rapid development of the electronics industry and users' demand, electronic devices are being manufactured to be smaller in size and weight. Thus, a high integration density is also required for semiconductor memory devices used in the electronic devices, and design rules for configurations of the semiconductor memory devices are being reduced. As a result, a process of connecting components included in the semiconductor memory devices is increasing in difficulty.

SUMMARY

The inventive concept provides a semiconductor memory device, which may reduce process difficulty during a process of manufacturing the semiconductor memory device, and ensure the reliability of connection between components.

According to an aspect of the inventive concept, there is provided a semiconductor memory device. The semiconductor memory device includes a plurality of bit line structures including bit lines extending in parallel in a first lateral direction on a substrate, and a plurality of buried contacts and a plurality of landing pads. The plurality of buried contacts fill lower portions of spaces between the plurality of bit line structures on the substrate, and the plurality of landing pads fill upper portions of the spaces between the plurality of bit line structures and extend on the plurality of bit line structures. The plurality of landing pads have a hexagonal array structure, and central points of respective top surfaces of a first landing pad, a second landing pad, and a third landing pad, which are adjacent to each other from among the plurality of landing pads, are connected by a scalene triangle.

According to another aspect of the inventive concept, there is provided a semiconductor memory device. The semiconductor memory device includes a substrate in which a plurality of active regions are defined, a plurality of word lines intersecting with the plurality of active regions and extending in parallel in a first lateral direction, a plurality of bit line structures including bit lines on the substrate, the bit lines extending in parallel in a second lateral direction perpendicular to the first lateral direction, a plurality of buried contacts and a plurality of landing pads, wherein the plurality of buried contacts fill lower portions of spaces between the plurality of bit line structures on the substrate, and the plurality of landing pads fill upper portions of the spaces between the plurality of bit line structures and extend on the plurality of bit line structures, and a plurality of storage nodes on the plurality of landing pads. The plurality of landing pads have a hexagonal array structure, and central points of respective top surfaces of three adjacent landing pads of the plurality of landing pads are connected by a scalene triangle. The plurality of storage nodes have a hexagonal array structure, and central points of respective top surfaces of three adjacent storage nodes of the plurality of storage nodes are connected by an equilateral triangle.

According to another aspect of the inventive concept, there is provided a semiconductor memory device. The semiconductor memory device includes a substrate in which a plurality of active regions are defined by a device isolation film, a plurality of word lines intersecting with the plurality of active regions and extending in parallel in a first lateral direction, a plurality of bit line structures located on the substrate, the plurality of bit line structures having bit lines extending in parallel in a second lateral direction perpendicular to the first lateral direction, a plurality of buried contacts filling lower portions of spaces between the plurality of bit line structures on the substrate, the plurality of buried contacts being connected to the plurality of active regions, a plurality of landing pads connected to the plurality of buried contacts, the plurality of landing pads filling upper portions of the spaces between the plurality of bit line structures and extending onto the plurality of bit line structures, wherein a top surface of each of the plurality of landing pads has a disc shape, and a plurality of storages located on the plurality of bit line structures and connected to the plurality of landing pads. First, second, and third sides of a triangle connecting central points of respective top surfaces of three adjacent landing pads, from among the plurality of landing pads, have a length of 3F (F represents a feature size), a length of less than 3F, and a length of more than 3F, respectively. Each of first, second, and third sides of a triangle connecting central points of respective top surfaces of three adjacent storages nodes, from among the plurality of storage nodes, has a length of 3F.

BRIEF DESCRIPTION OF THE DRAWINGS

Embodiments of the inventive concept will be more clearly understood from the following detailed description taken in conjunction with the accompanying drawings in which like numbers refer to like elements throughout. In the drawings.

DETAILED DESCRIPTION OF THE EMBODIMENTS

Figure 1:
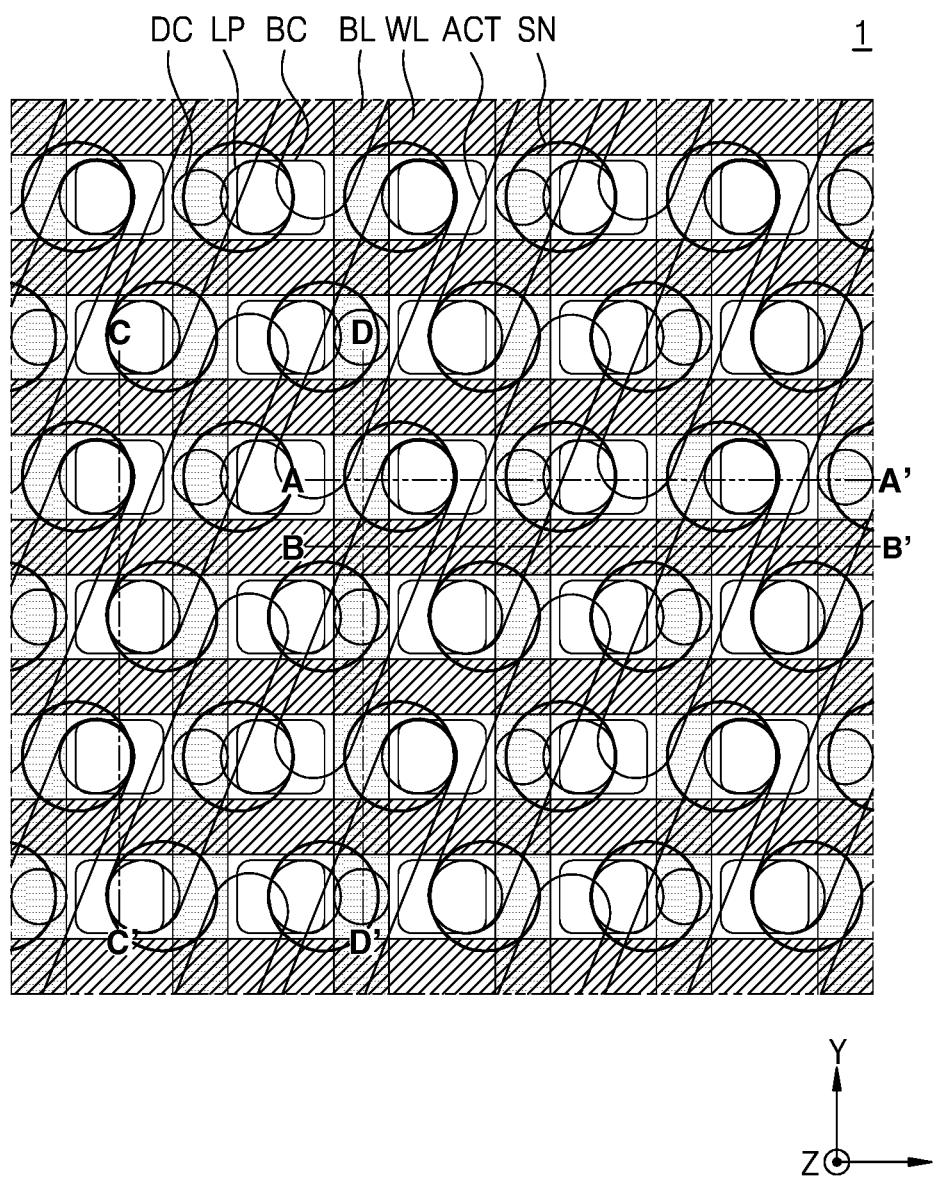
FIG. 1 is a schematic plan layout of main components of a semiconductor memory device, according to an example embodiment.

FIG. 1 is a schematic plan layout of main components of a semiconductor memory device 1, according to an example embodiment.

Referring to FIG. 1, the semiconductor memory device 1 may include a plurality of active regions ACT. In some embodiments, each of the plurality of active regions ACT may be arranged to have major axes in an oblique direction to a first lateral direction (X direction) and a second lateral direction (Y direction), which are perpendicular to each other.

A plurality of word lines WL may intersect with the plurality of active regions ACT and extend in parallel in the first lateral direction (X direction). A plurality of bit lines BL may be arranged on the plurality of word lines WL and extend in parallel in the second lateral direction (Y direction) that intersects with the first lateral direction (X direction).

The plurality of bit lines BL may be connected to the plurality of active regions ACT through direct contacts DC.

In some embodiments, a plurality of buried contacts BC may be formed between two adjacent ones of the plurality of bit lines BL. In some embodiments, the plurality of buried contacts BC may be arranged in a line in each of the first lateral direction (X direction) and the second lateral direction (Y direction).

A plurality of landing pads LP may be respectively formed on the plurality of buried contacts BC. The plurality of landing pads LP may be arranged to at least partially overlap the plurality of buried contacts BC. In some embodiments, each of the plurality of landing pads LP may extend onto any one of two bit lines BL, which are adjacent to each other. The plurality of landing pads LP may have a hexagonal array structure when viewed from above. For example, when viewed from above, the plurality of landing pads LP may be arranged in a line in the first lateral direction (X direction) and arranged in zigzag in the second lateral direction (Y direction) to form a honeycomb shape. For example, when viewed from above, the honeycomb shape may consist of a group of six landing pads LP arranged in a hexagonal array structure, with each of the six landing pads LP at a corresponding corner of the hexagon, and a seventh landing pad LP located inside the hexagon formed by the group of six landing pads LP.

The plurality of landing pads LP may be formed using, for example, an extreme ultraviolet (EUV) lithography process. In some embodiments, the plurality of landing pads LP may be formed without using a pattern density-increasing technique including one photolithography process, such as double patterning technology (DPT) or quadruple patterning technology (QPT). A top surface of each of the plurality of landing pads LP may have a disc shape of which edges are not elliptical but substantially circular.

A plurality of storage nodes SN may be formed on the plurality of landing pads LP. The plurality of storage nodes SN may be formed over the plurality of bit lines BL. Each of the plurality of storage nodes SN may be a lower electrode of a plurality of capacitors. The storage node SN may be connected to the active regions ACT through the landing pad LP and the buried contact BC. The plurality of storage nodes SN may have a hexagonal array structure when viewed from above. For example, when viewed from above, the plurality of storage nodes SN may be arranged in a line in the first lateral direction (X direction) and arranged in zigzag in the second lateral direction (Y direction) to form a honeycomb shape. For example, when viewed from above, the honeycomb shape may consist of a group of six storage nodes SN arranged in a hexagonal array structure, with each of the storage nodes SN at a corresponding corner of the hexagon, and a seventh storage nodes SN located inside the hexagon formed by the group of six storage nodes SN.

The honeycomb shape in which the plurality of landing pads LP are arranged may be somewhat different from the honeycomb shape in which the plurality of storage nodes SN are arranged. For example, central points of three adjacent ones of the plurality of landing pads LP may be connected by a scalene triangle, and central points of three adjacent ones of the plurality of storage nodes SN may be connected by an isosceles triangle or an equilateral triangle (or regular triangle). This arrangement will be described in detail with reference to FIGS. 2A to 2C. The three adjacent ones of the plurality of landing pads LP may include two landing pads LP at adjacent corners of the hexagonal structure and one landing pad LP located inside the hexagon formed by the group of six landing pads LP, and the three adjacent ones of the plurality of storage nodes SN may include two storage nodes SN at adjacent corners of the hexagonal structure and one storage nodes SN located inside the hexagon formed by the group of six storage nodes SN.

As used herein, the central point of the landing pad LP and the central point of the storage node SN may respectively refer to the central point of the top surface of the landing pad LP and the central point of the top surface of the storage node SN when viewed from above (on an X-Y plane).

Figure 2A:
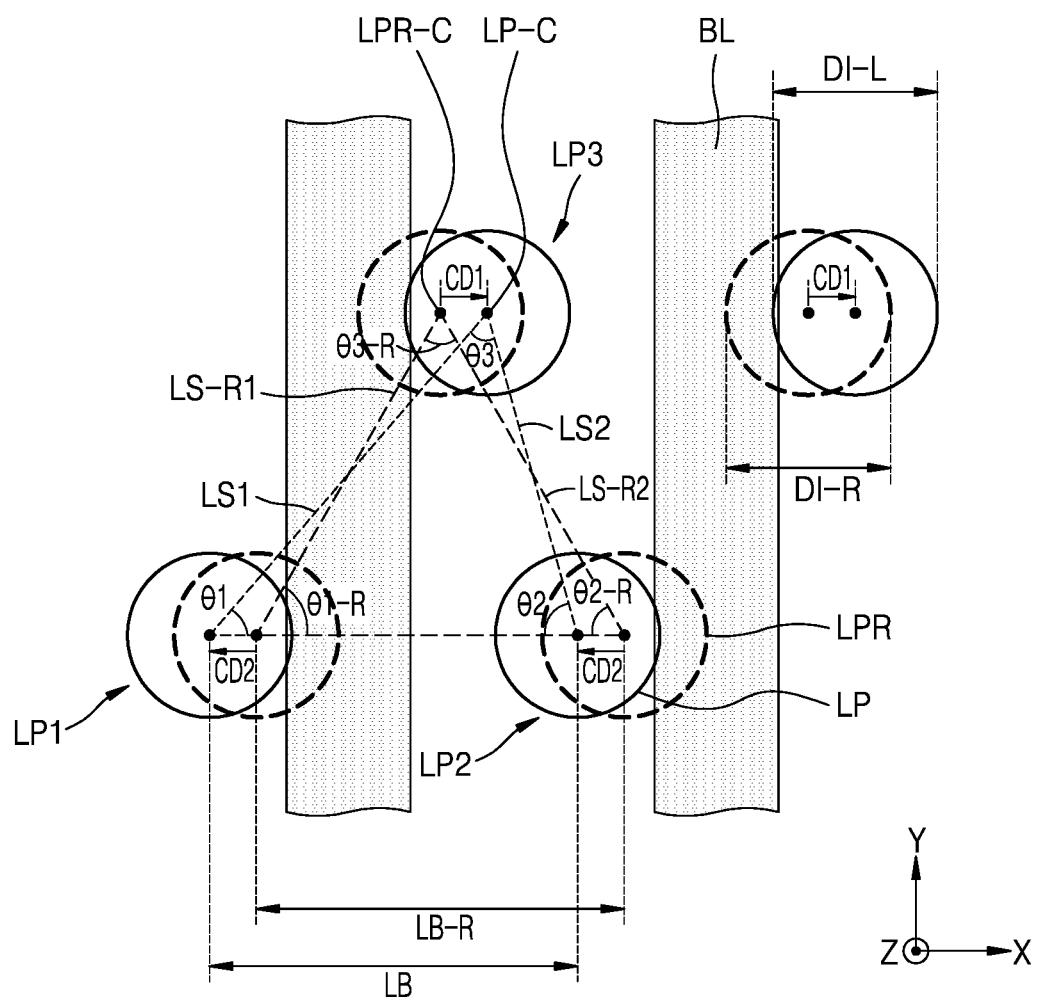
FIGS. 2A to 2C are schematic plan layouts illustrating the arrangement of landing pads included in a semiconductor memory device, according to an example embodiment.
Figure 2B:
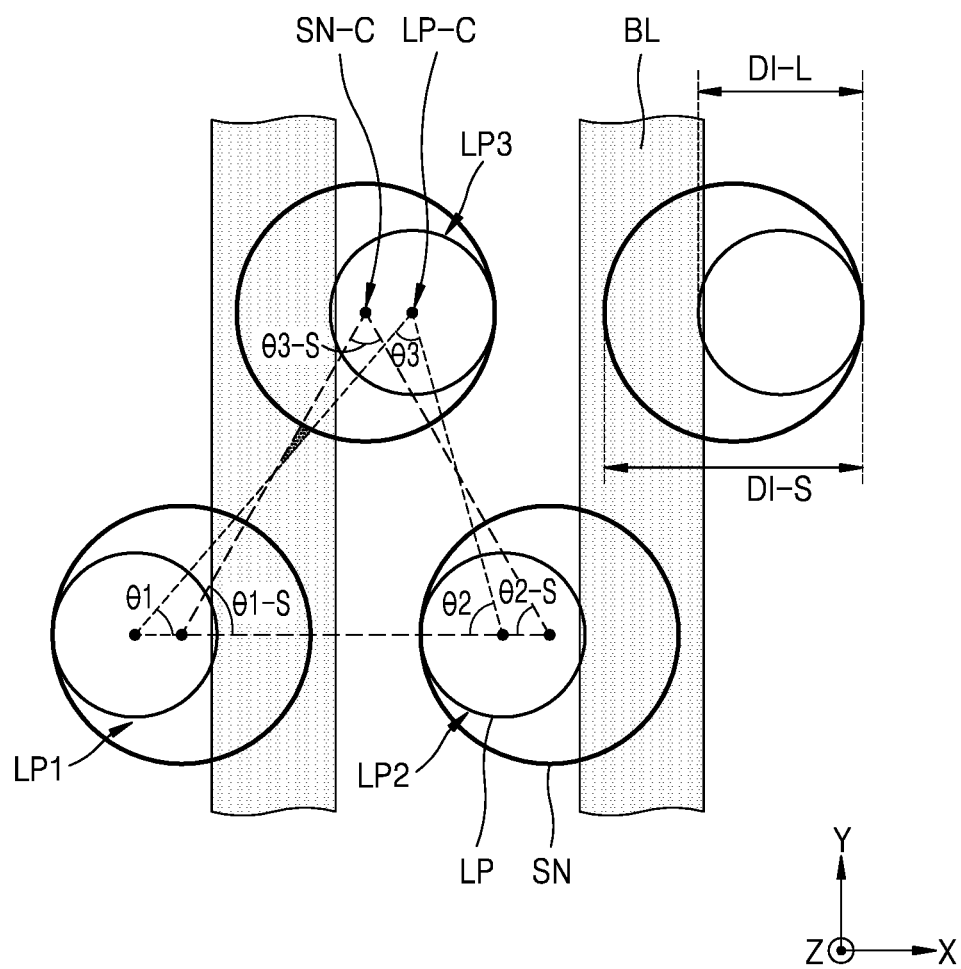
Figure 2C:
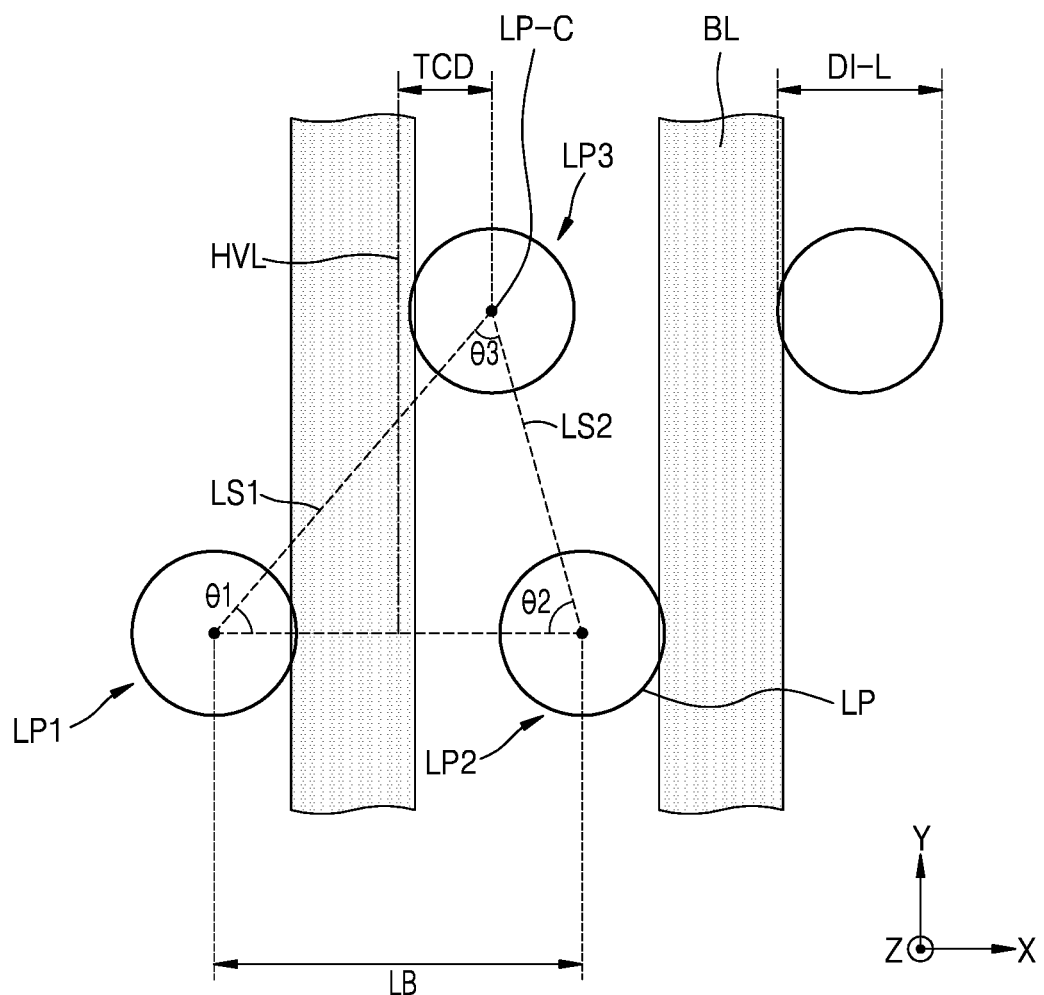
Figure 3A:
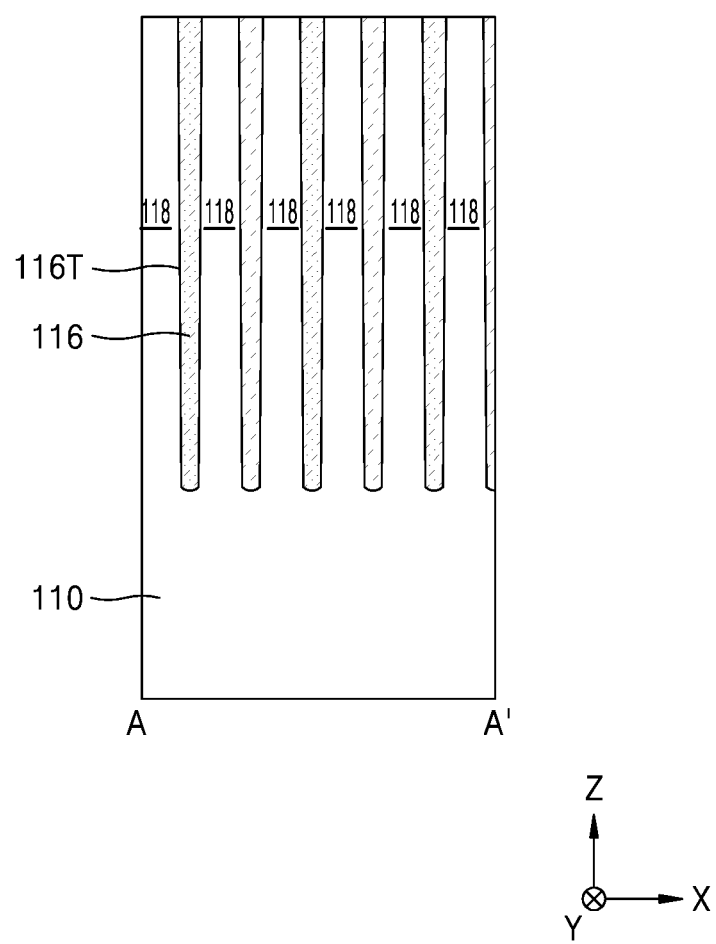
FIGS. 3A-3D, 4A-4D, 5A-5D, and 6A-6D are cross-sectional views of a process sequence of a method of manufacturing a semiconductor memory device, according to an example embodiment.
Figure 3B:
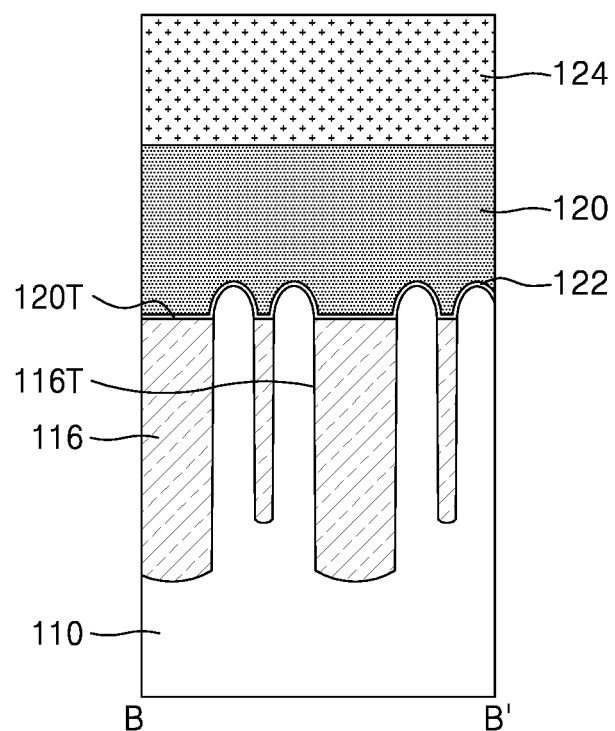
Figure 3C:
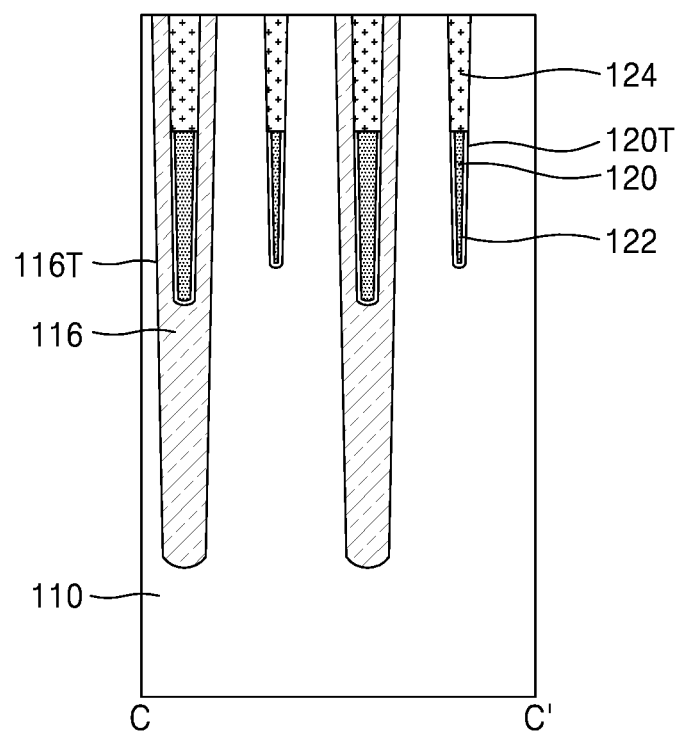
Figure 3D:
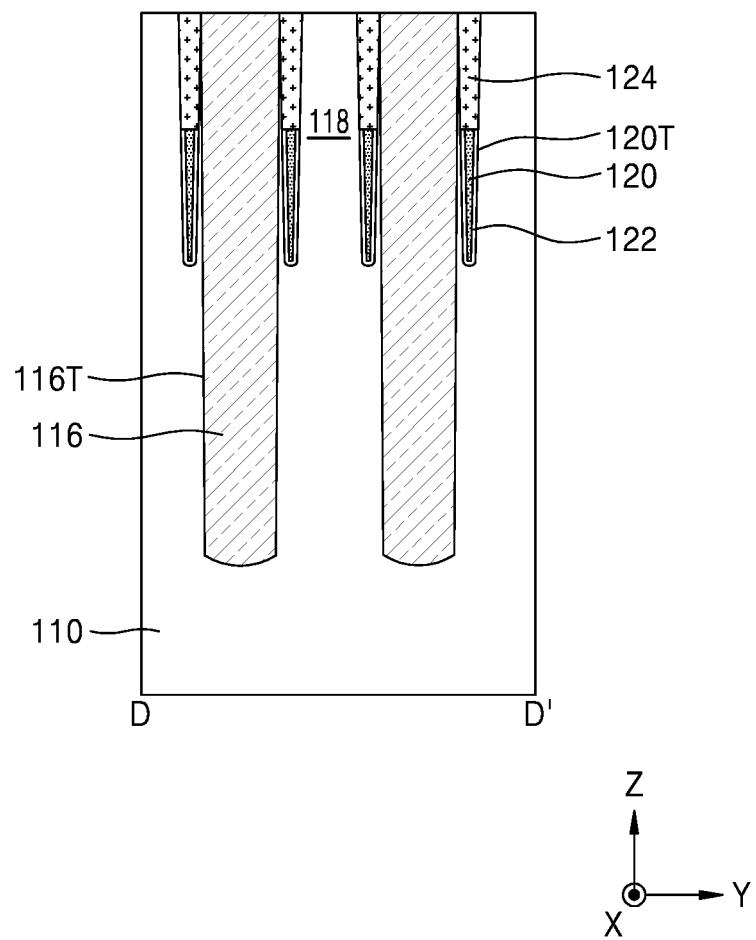
Figure 4A:
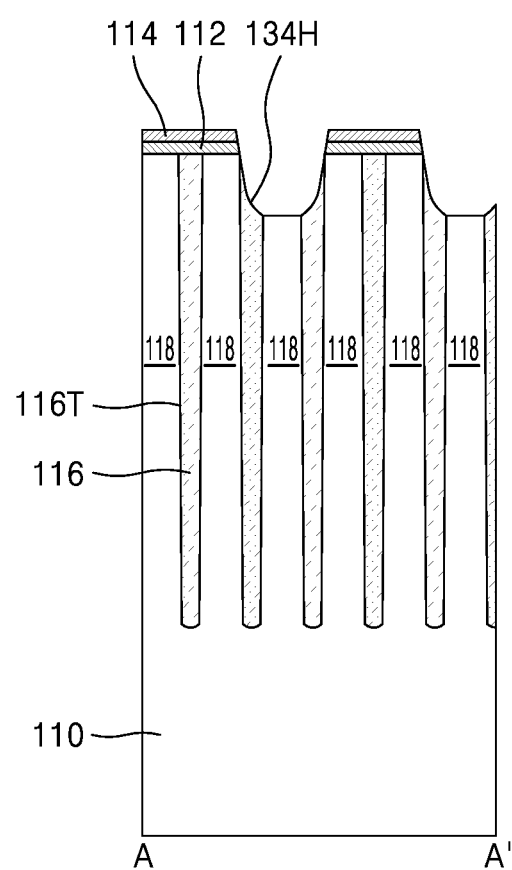
Figure 4A:
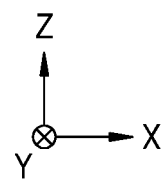
Figure 4B:
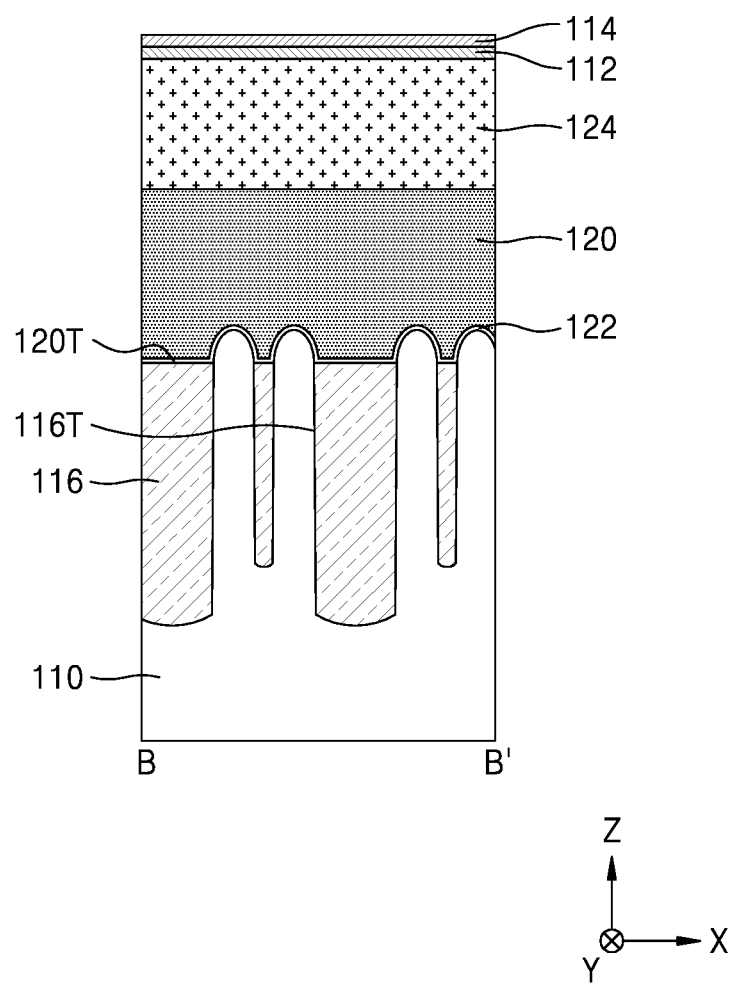
Figure 4C:
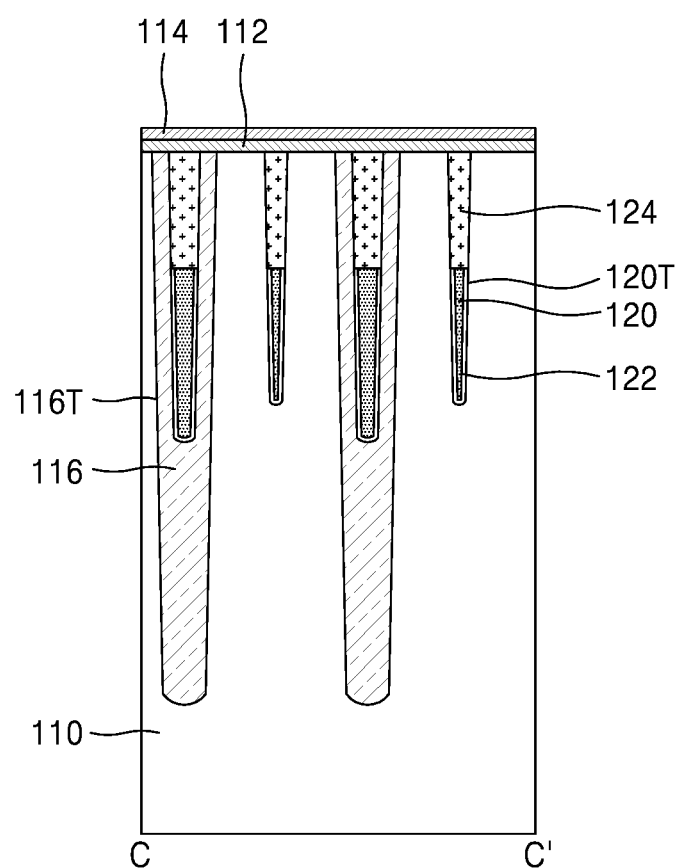
Figure 4D:
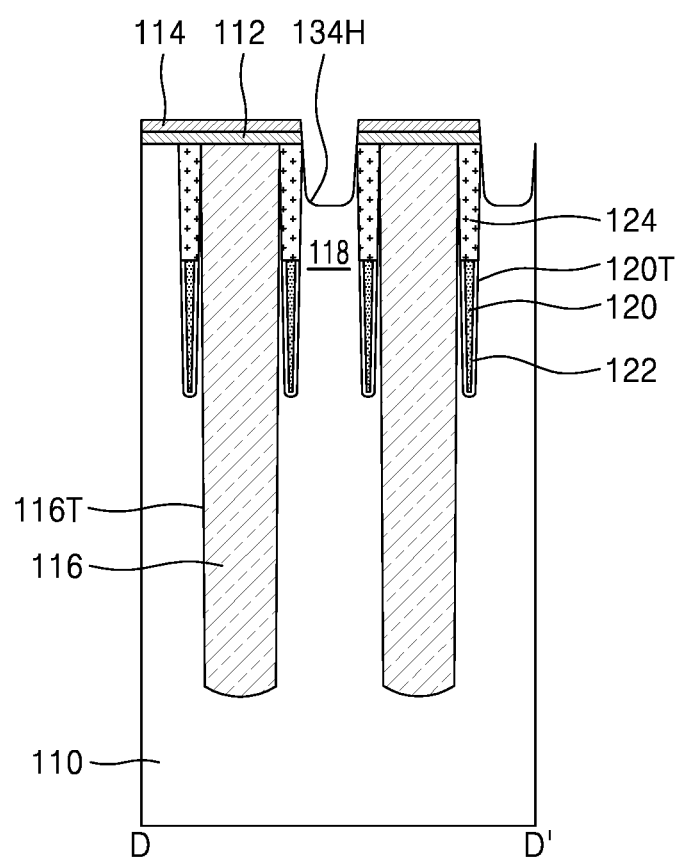
Figure 5A:
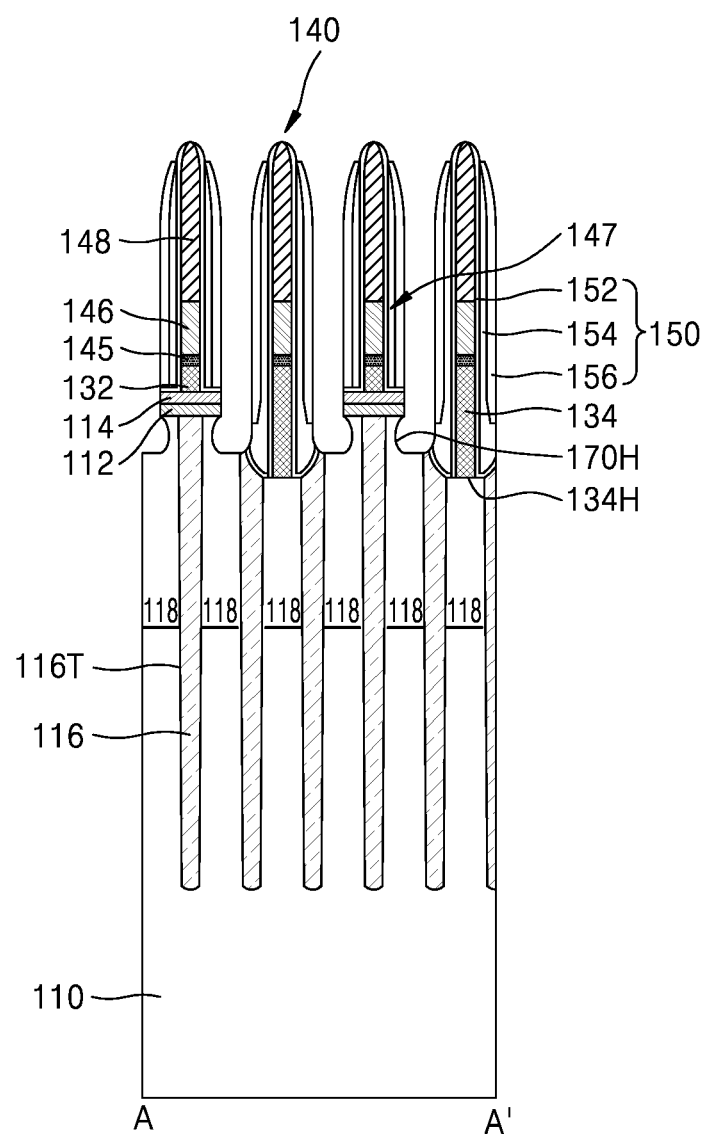
Figure 5A:
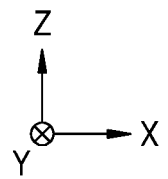
Figure 5B:
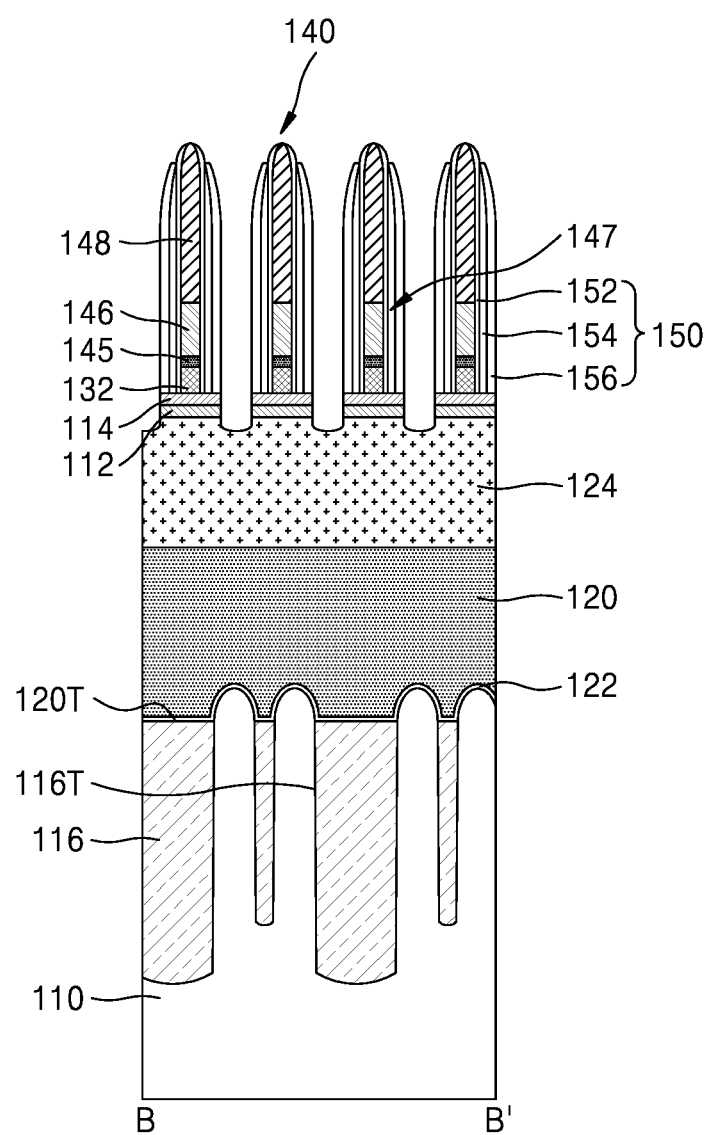
Figure 5C:
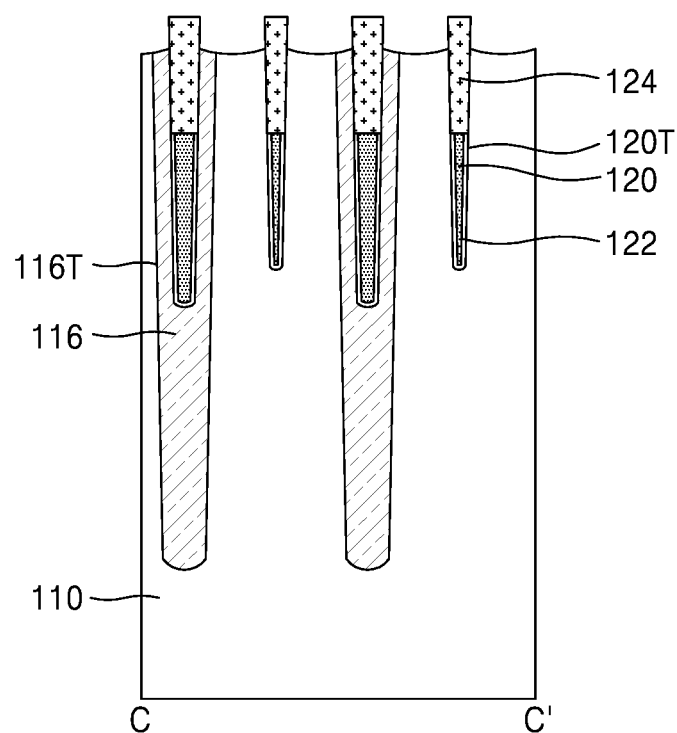
Figure 5D:
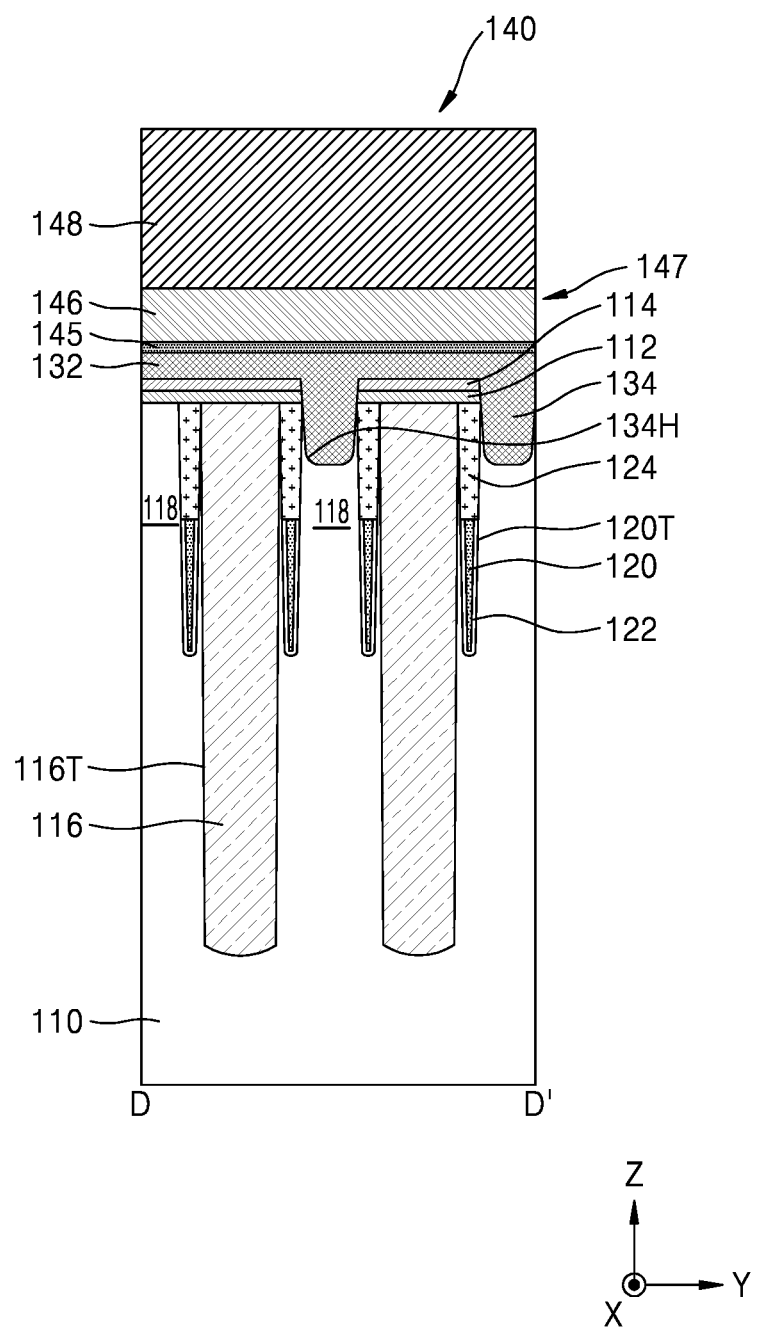
Figure 6A:
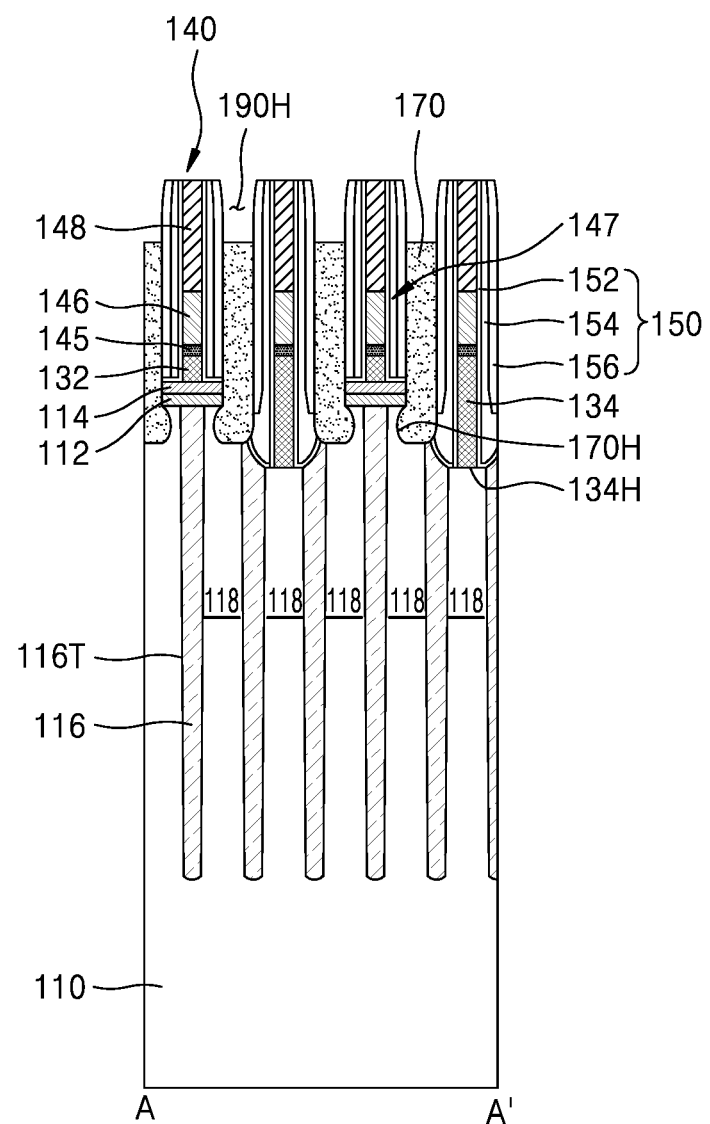
Figure 6B:
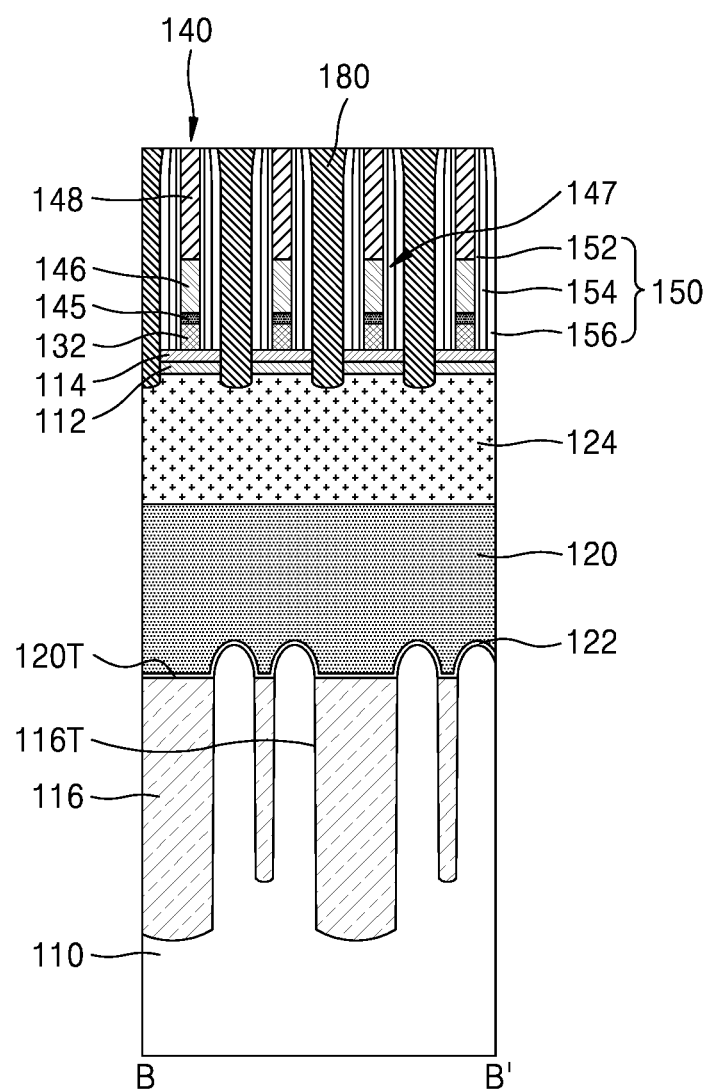
Figure 6C:
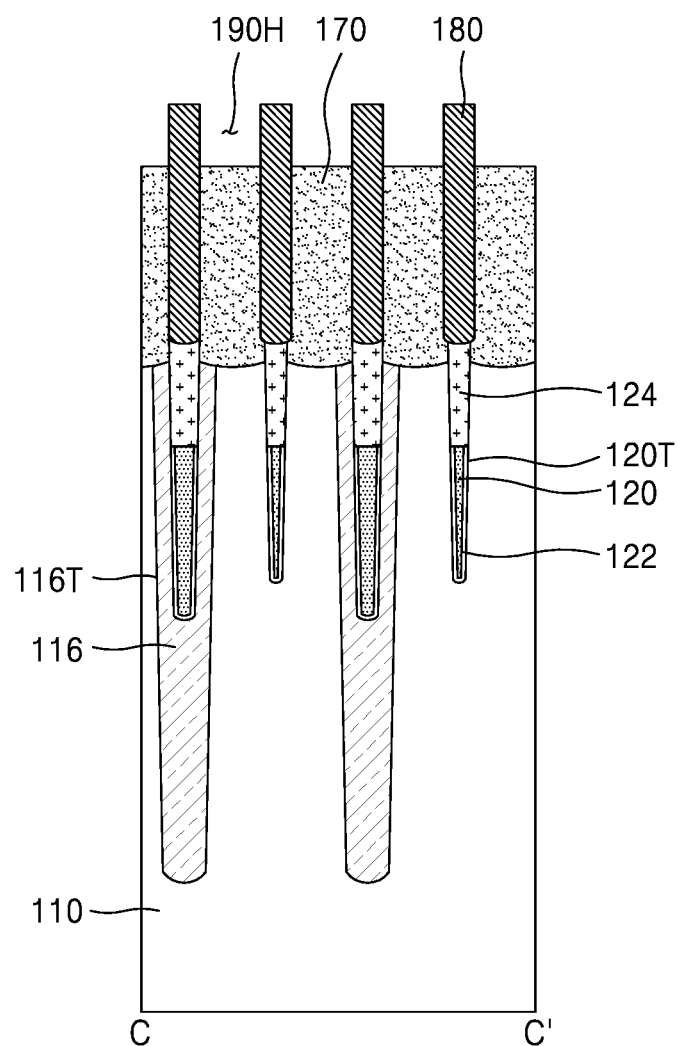
Figure 6D:
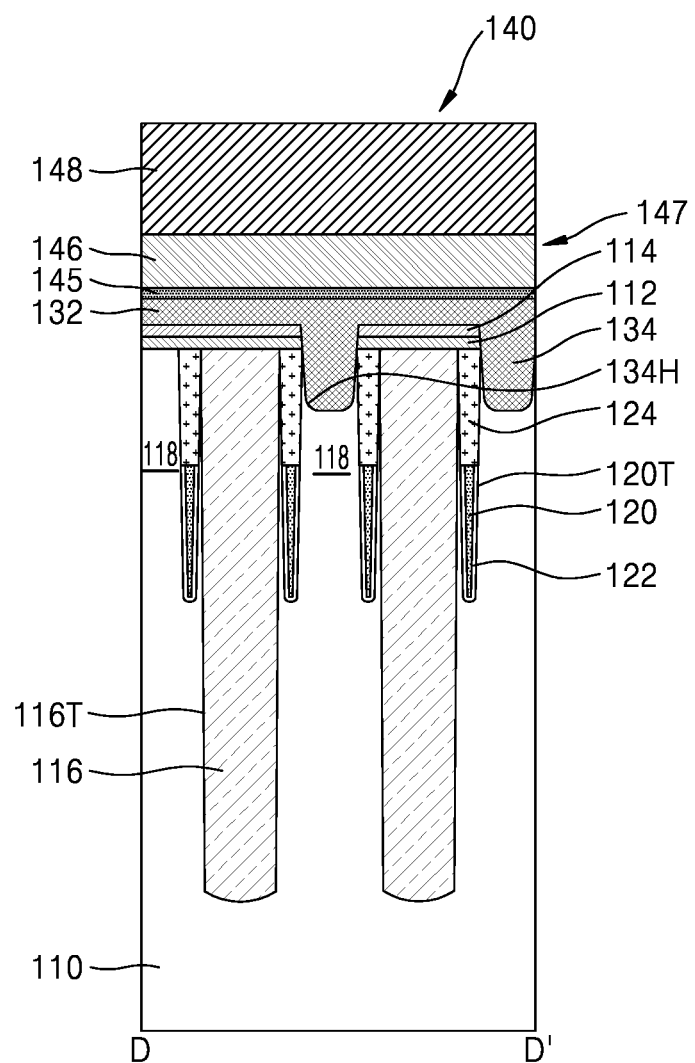

FIGS. 2A to 2C are schematic plan layouts illustrating the arrangement of landing pads included in a semiconductor memory device according to embodiments.

Referring to FIG. 2A, a plurality of landing pads LP may have a hexagonal array structure when viewed from above. For example, the plurality of landing pads LP may be arranged in a line in a first lateral direction (X direction) and arranged in zigzag in a second lateral direction (Y direction) to form a honeycomb shape.

The landing pads LP and imaginary reference landing pads LPR are illustrated together in FIG. 2A in order to explain the arrangement of the plurality of landing pads LP. In a plurality of reference landing pads LPR, central points LPR-C of three adjacent reference landing pads LPR may be connected by an isosceles triangle or an equilateral triangle, and at least two of three interior angles of a triangle connecting the central points LPR-C of the three adjacent reference landing pads LPR may have the same value. A diameter DI-R of the reference landing pad LPR may be equal to a diameter DI-L of the landing pad LP. In some embodiments, the plurality of reference landing pads LPR may be formed using a pattern density-increasing technique including one photolithography process, such as DPT or QPT.

For example, a first reference interior angle θ1-R and a second reference interior angle θ2-R may be interior angles between a base connecting the respective central points LPR-C of two reference landing pads LPR, which are adjacent to each other in a first lateral direction (X direction), from among the three adjacent reference landing pads LPR, and two sides connecting the respective central points LPR-C of the two reference landing pads LPR, which are adjacent to each other in the first lateral direction (X direction), with the central point LPR-C of one reference landing pad LPR, which is adjacent to the two landing pads LPR in a second lateral direction (Y direction). The first reference interior angle θ1-R may be equal to the second reference interior angle θ2-R. In some embodiments, a third reference interior angle θ3-R may be an interior angle between the two sides connecting the respective central points LPR-C of the two reference landing pads LPR which are adjacent to each other in the first lateral direction (X direction), and the central point LPR-C of the one reference landing pad LPR, which is adjacent to the two landing pads LPR in the second lateral direction (Y direction). The third reference interior angle θ3-R may be equal to each of the first reference interior angle θ1-R and the second reference interior angle θ2-R. For example, each of the first reference interior angle θ1-R, the second reference interior angle θ2-R, and the third reference interior angle θ3-R may be 60°.

In three adjacent reference landing pads LPR, a distance between the respective central points LPR-C of two reference landing pads LPR, which are adjacent to each other in the first lateral direction (X direction), may be referred to as a reference base distance LB-R. Distances from the respective central points LPR-C of the two reference landing pads LPR, which are adjacent to each other in the first lateral direction (X direction), to the central point LPR-C of one reference landing pad LPR, which is adjacent to the two reference landing pads LPR in the second lateral direction (Y direction), may be referred to as a first reference side distance LS-R1 and a second reference side distance LS-R2, respectively.

The first reference side distance LS-R1 may be equal to the second reference side distance LS-R2. For example, the first reference side distance LS-R1 and the second reference side distance LS-R2 may have a value of 3F (here, F represents a feature size). For example, 3F may be about 25.6 nm, but is not limited thereto. In some embodiments, the first reference side distance LS-R1, the second reference side distance LS-R2, and the reference base distance LB-R may have the same value of a reference distance. For example, each of the first reference side distance LS-R1, the second reference side distance LS-R2, and the reference base distance LB-R, which is equal to the reference distance, may have a value of 3F. In some other embodiments, the reference base distance LB-R may be the reference distance, and the first reference side distance LS-R1 and the second reference side distance LS-R2 may have the same value, which may be greater or smaller than the reference distance.

In three adjacent landing pads LP of the plurality of landing pads LP, for example, respective central points LP-C of two landing pads LP, which are adjacent to each other in the first lateral direction (X direction), and a central point LP-C of one landing pad LP, which is adjacent to the two adjacent landing pads LP in the second lateral direction (Y direction), may be connected by a scalene triangle.

From among the plurality of landing pads LP, three landing pads LP, which are adjacent to each other such that lines connecting the central points LP-C of the three landing pads LP form a triangle, may be respectively referred to as a first landing pad LP1, a second landing pad LP2, and a third landing pad LP3 for brevity. For example, two landing pads LP, which are adjacent to each other in the first lateral direction (X direction), may be respectively referred to as the first landing pad LP1 and the second landing pad LP2, and one landing pad LP, which is adjacent to the first landing pad LP1 and the second landing pad LP2 in the second lateral direction (Y direction) between the first and second landing pads LP1 and LP2, may be referred to as the third landing pad LP3.

Three interior angles of a triangle connecting the respective central points LP-C of the first landing pad LP1, the second landing pad LP2, and the third landing pad LP3 may be respectively different from one another. For example, a first interior angle θ1 may be an interior angle between a base connecting the respective central points LP-C of the first landing pad LP1 and the second landing pad LP2 and a side connecting the first landing pad LP1 and the third landing pad LP3. A second interior angle θ2 may be an interior angle between a base connecting the respective central points LP-C of the first landing pad LP1 and the second landing pad LP2 and a side connecting the second landing pad LP2 and the third landing pad LP3. A third interior angle θ3 may be an interior angle between the side connecting the first landing pad LP1 and the third landing pad LP3 and the side connecting the second landing pad LP2 and the third landing pad LP3. The first interior angle θ1, the second interior angle θ2, and the third interior angle θ3 may be respectively different from one another. The first interior angle θ1 may be different from the second interior angle θ2. For example, the first interior angle θ1 may be greater than 60°, and the second interior angle θ2 may be less than 60°. The third interior angle θ3 may have a value obtained by subtracting the first interior angle θ1 and the second interior angle θ2 from 180°.

A distance between the respective central points LP-C of the first landing pad LP1 and the second landing pad LP2 may be referred to as a base distance LB, and a distance between the respective central points LP-C of the first landing pad LP1 and the third landing pad LP3 may be referred to as a first side distance LS1. Also, a distance between the respective central points LP-C of the second landing pad LP2 and the third landing pad LP3 may be referred to as a second side distance LS2.

The base distance LB and the reference base distance LB-R may have the same value (i.e., the reference distance). For example, the base distance LB may have a value of 3F.

The first side distance LS1 may be different from the second side distance LS2. In some embodiments, the first side distance LS1 may be less than the base distance LB (i.e., the reference distance), and the second side distance LS2 may be greater than the base distance LB (i.e., the reference distance). For example, the first side distance LS1 may be less than 3F, and the second side distance LS may be greater than 3F.

The plurality of landing pads LP may be arranged in a line in the first lateral direction (X direction) and arranged in zigzag in the second lateral direction (Y direction). Also, the plurality of reference landing pads LPR may be arranged in a line in the first lateral direction (X direction) and arranged in zigzag in the second lateral direction (Y direction). Each of the plurality of landing pads LP and the plurality of reference landing pads LPR may extend on one of two adjacent bit lines BL, which corresponds thereto. In some embodiments, the plurality of landing pads LP may not extend on the bit lines BL. For example, only a portion of the plurality of landing pads LP may extend on one of two adjacent the bit lines BL.

The central point LP-C of each of the plurality of landing pads LP may be shifted from the central point LPR-C of each of the plurality of reference landing pads LPR in the first lateral direction (X direction) or in a direction (−X direction) opposite to the first lateral direction (X direction) in a direction away from the bit line BL adjacent thereto.

For example, respective central points LP-C of landing pads LP arranged in one row in the first lateral direction (X direction) may be shifted from respective central points LPR-C of reference landing pads LPR arranged in one row in the first lateral direction (X direction) by a first travel distance CD1 in the first lateral direction (X direction). Also, respective central points LP-C of landing pads LP, which are adjacent to the landing pads LP arranged in the one row in the second lateral direction (Y direction) and arranged in another line in the first lateral direction (X direction), may be shifted from respective central points LPR-C of reference landing pads LPR arranged in one row in the first lateral direction (X direction) by a second travel distance CD2 in the direction (−X direction) opposite to the first lateral direction (X direction). In some embodiments, the first travel distance CD1 may be equal to the second travel distance CD2. For example, each of the first travel distance CD1 and the second travel distance CD2 may be greater than 0 and less than 0.75F. In some embodiments, each of the first travel distance CD1 and the second travel distance CD2 may range from about 1 nm to about 6 nm.

The plurality of landing pads LP may be formed using, for example, an EUV lithography process. In some embodiments, the plurality of landing pads LP may be formed without using a pattern density-increasing technique including one photolithography process, such as DPT or QPT.

Accordingly, unlike the plurality of reference landing pads LPR shown in FIG. 2A, the plurality of landing pads LP may be formed to have a distorted honeycomb shape.

As compared to the reference landing pad LPR, the central point LP-C of the landing pad LP may be shifted in a direction away from the bit line BL adjacent thereto. Thus, a width (in the first lateral direction (X direction)) of the landing pad LP extending in a vertical direction (Z direction) may be increased along a side surface of the adjacent bit line BL.

Accordingly, an overlap margin between the landing pad LP and the buried contact (e.g., buried contact BC in FIG. 1), which correspond to each other, may be increased. Thus, the reliability of electrical connection between the landing pad LP and the buried contact BC, which correspond to each other, may be improved. In addition, a distance in the first lateral direction (X direction) between one landing pad LP and a buried contact BC corresponding to another landing pad LP adjacent thereto may be increased. Thus, the occurrence of a bridge between the landing pad LP and another buried contact BC adjacent to a buried contact BC corresponding thereto may be prevented.

When the plurality of landing pads LP are formed using a pattern density-increasing technique including one photolithography process, such as DPT or QPT, a top surface of each of the plurality of landing pads LP may have a rhombus or parallelogram shape of which edges are not circular or have a rhombus or parallelogram shape with rounded edges. However, since the plurality of landing pads LP according to the present embodiment may be formed using an EUV lithography process, a top surface of each of the plurality of landing pads LP may have a disc shape of which edges are not elliptical but substantially circular.

Accordingly, a distance between the respective landing pads LP may be increased. Thus, the occurrence of a bridge between adjacent landing pads LP may be prevented, and gap-fill characteristics of an insulating structure (e.g., insulating structures 195 in FIGS. 10A to 10D) filling each of spaces between the plurality of landing pads LP may be improved. As a result, the reliability of electrical insulation between the respective landing pads LP may be improved.

Referring to FIG. 2B, a plurality of storage nodes SN may be located on the plurality of landing pads LP. For example, when viewed in plan view, each storage node SN may completely overlap a corresponding one of the landing pads LP. A diameter DI-S of the storage node SN may be greater than the diameter DI-L of the landing pad LP. The plurality of landing pads LP may be arranged to have a distorted honeycomb shape as described with reference to FIG. 2A. The plurality of storage nodes SN may be arranged in a complete honeycomb shape.

The respective central points LP-C of the first landing pad LP1, the second landing pad LP2, and the third landing pad LP3 may be connected by a scalene triangle. For example, the first interior angle $\theta 1$ and the second interior angle $\theta 2$ of a triangle connecting the respective central pints LP-C of the first landing pad LP1 the second landing pad LP2, and the third landing pad LP3 may be different. For example, the first interior angle $\theta 1$ may be greater than 60°, the second interior angle $\theta 2$ may be less than 60°, and the third interior angle $\theta 3$ may have a value obtained by subtracting the first interior angle $\theta 1$ and the second interior angle $\theta 2$ from 180°.

Respective central points SN-C of three storage nodes SN corresponding respectively to the first landing pad LP1, the second landing pad LP2, and the third landing pad LP3 may be connected by an isosceles triangle or an equilateral triangle. For example, a distance between the central point SN-C of the storage node SN corresponding to the first landing pad LP1 and the central point SN-C of the storage node SN corresponding to the third landing pad LP3 may be equal to a distance between the central point SN-C of the storage node SN corresponding to the second landing pad LP2 and the central point SN-C of the storage node SN corresponding to the third landing pad LP3. In some embodiments, distances between the central points SN-C of three storage nodes SN corresponding respectively to the first landing pad LP1, the second landing pad LP2, and the third landing pad LP3 may have the same value of a reference distance. For example, the reference distance may be 3F. In some other embodiments, a distance between the central point SN-C of the storage node SN corresponding to the first landing pad LP1 and the central point SN-C of the storage node SN corresponding to the second landing pad LP2 may have the same value as the reference distance. A distance between the central point SN-C of the storage node SN corresponding to the first landing pad LP1 and the central point SN-C of the storage node SN corresponding to the third landing pad LP3 and a distance between the central point SN-C of the storage node SN corresponding to the second landing pad LP2 and the central point SN-C of the storage node SN corresponding to the third landing pad LP3 may have the same value, which is somewhat greater or less than the reference distance.

A triangle connecting the central points SN-C of the three storage nodes SN corresponding respectively to the first landing pad LP1, the second landing pad LP2, and the third landing pad LP3 may have a first node interior angle $\theta 1$-S and a second node interior angle $\theta 2$-S, which have the same value. In some embodiments, a third node interior angle $\theta 3$-S may be equal to each of the first node interior angle $\theta 1$-S and the second node interior angle $\theta 2$-S. For instance, each of the first node interior angle $\theta 1$-S, the second node interior angle $\theta 2$-S, and the third node interior angle $\theta 3$-S may be 60°.

Referring to FIG. 2C, the plurality of landing pads LP may have a hexagonal array structure. For example, the plurality of landing pads LP may be arranged in a line in the first lateral direction (X direction) and arranged in zigzag in the second lateral direction (Y direction) to form a honeycomb shape.

The respective central points LP-C of three adjacent landing pads LP (i.e., the first landing pad LP1, the second landing pad LP2, and the third landing pad LP3) may be connected by a scalene triangle. Three interior angles of a triangle connecting the respective central points LP-C of the first landing pad LP1, the second landing pad LP2, and the third landing pad LP3 may be respectively different from one another. The first interior angle $\theta 1$ may be different from the second interior angle $\theta 2$. For example, the first interior angle $\theta 1$ may be greater than 60°, and the second interior angle $\theta 2$ may be less than 60°. The third interior angle $\theta 3$ may have a value obtained by subtracting the first interior angle θ1 and the second interior angle θ2 from 180°.

The first side distance LS1 may be different from the second side distance LS2. In some embodiments, the first side distance LS1 may be less than the base distance LB, and the second side distance LS2 may be greater than the base distance LB. For example, the first side distance LS1 may be less than 3F, and the second side distance LS may be greater than 3F.

An imaginary central extension line HVL may extend from a center of a base connecting the respective central points LP-C of the first landing pad LP1 and the second landing pad LP2 in the second lateral direction (Y direction). The imaginary central extension line HVL may be perpendicular to the base connecting the respective central points LP-C of the first landing pad LP1 and the second landing pad LP2. The central point LP-C of the third landing pad LP3 may be spaced apart from the imaginary central extension line HVL by a central travel distance TCD in the first lateral direction (X direction). The central point LP-C of the third landing pad LP3 may be shifted from the imaginary central extension line HVL by the central travel distance TCD in the first lateral direction (X direction) in a direction away from the bit line BL. The central travel distance TCD may be equal to the sum of the first travel distance CD1 and the second travel distance CD2 shown in FIG. 2A. The central travel distance TCD may be greater than 0 and less than half of the base distance LB. For example, the central travel distance TCD may be greater than 0 and less than 1.5F. In some embodiments, the central travel distance TCD may range from about 2 nm to about 12 nm.

As described with reference to FIG. 2A, the reliability of an electrical connection between the landing pad LP according to the present embodiment and the buried contact BC corresponding thereto may be improved, and the occurrence of a bridge between the landing pad LP and another buried contact BC adjacent to the buried contact BC corresponding thereto may be prevented. In addition, the reliability of electrical insulation between the respective landing pads LP may be improved.

Furthermore, as described with reference to FIG. 2B, the plurality of storage nodes SN according to the present embodiment may be arranged in a honeycomb shape such that the respective central points SN-C of the three adjacent storage nodes SN are connected by the isosceles triangle or the equilateral triangle. Accordingly, each of the plurality of storage nodes SN may have the diameter DI-S greater than the diameter DI-L of the landing pad LP, and also may prevent the occurrence of a bridge between adjacent storage nodes SN. Therefore, a capacitance of each of a plurality of capacitor structures (e.g., capacitor structures 200 in FIGS. 10A and 10C) may be increased, and thus, the data retention reliability of each of the plurality of capacitor structures 200 may be improved.

Figure 7A:
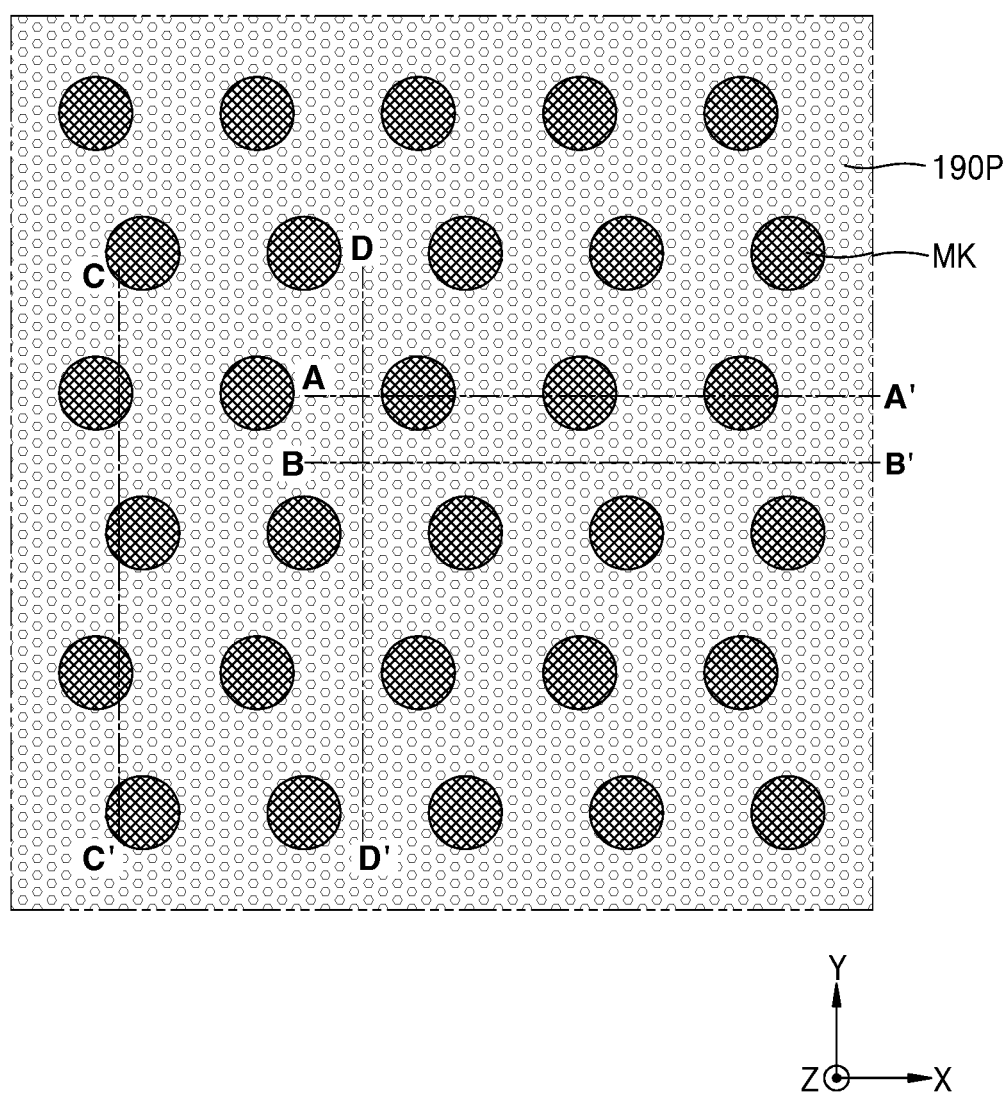
FIG. 7A is a plan view of an operation of forming mask patterns for forming landing pads included in a semiconductor memory device, according to an example embodiment.
Figure 7B:
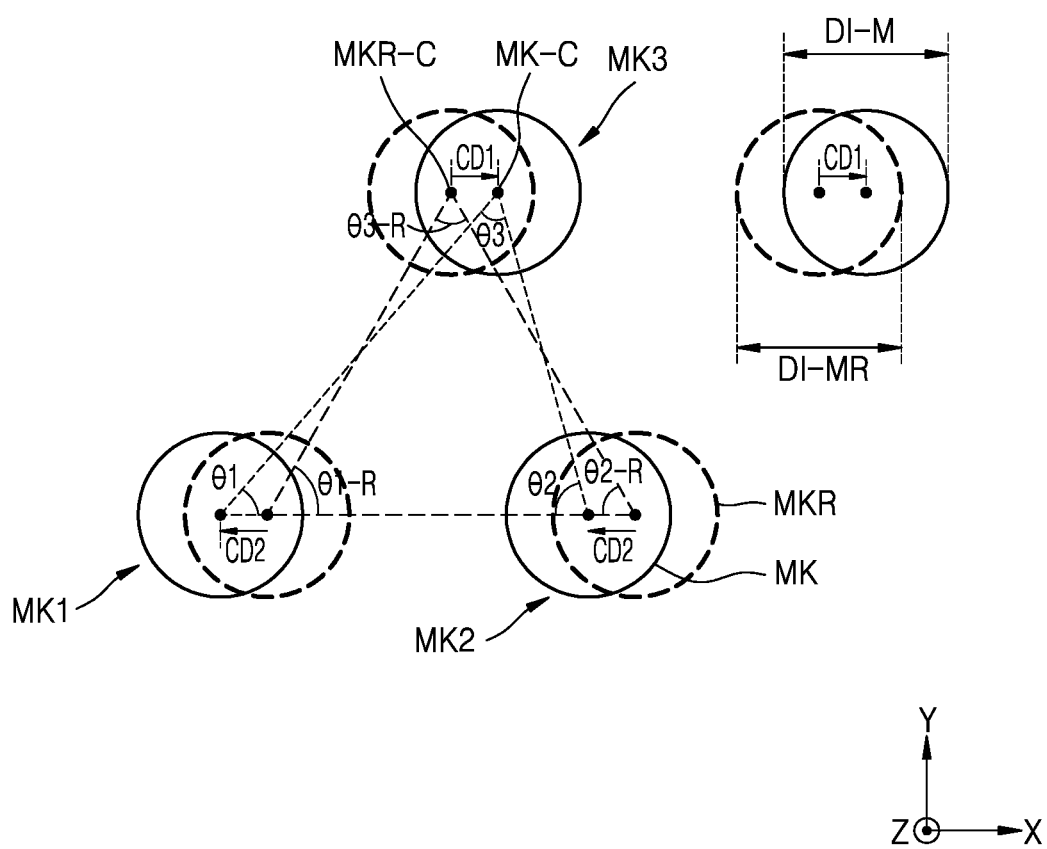
FIG. 7B is a schematic plan layout illustrating the arrangement of the mask patterns of FIG. 7A.
Figure 8A:
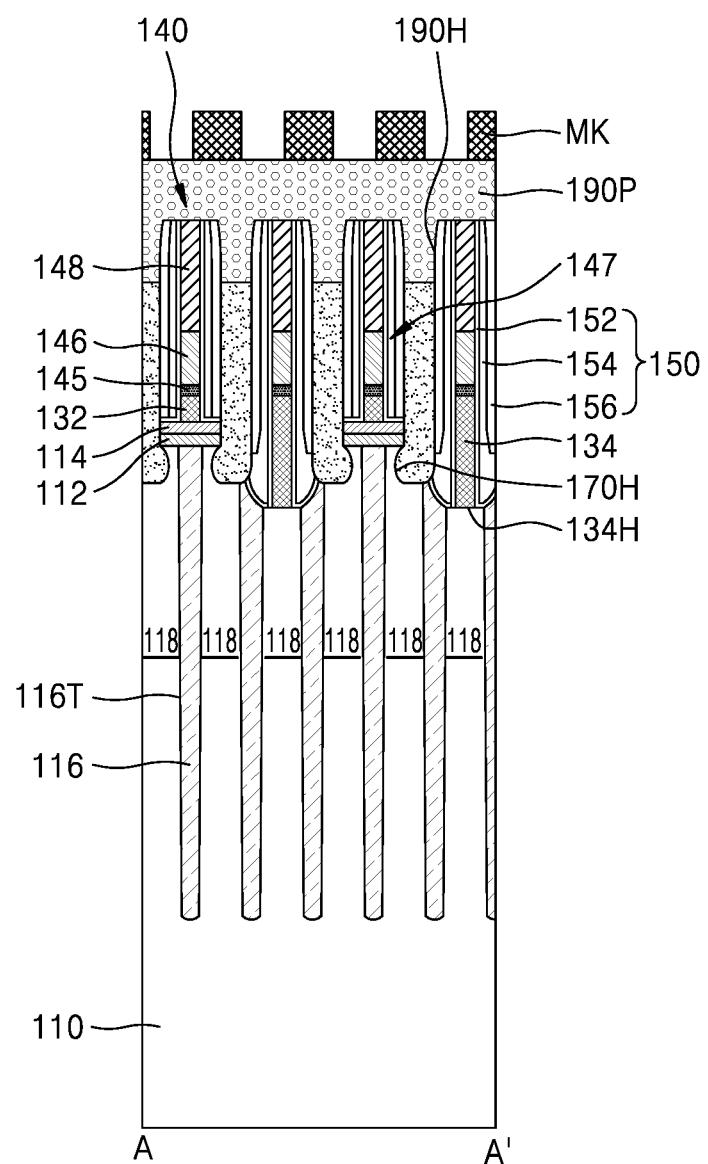
FIGS. 8A-8D, 9A-9D, and 10A-10D are cross-sectional views of a process sequence of a method of manufacturing a semiconductor memory device, according to an example embodiment.
Figure 8B:
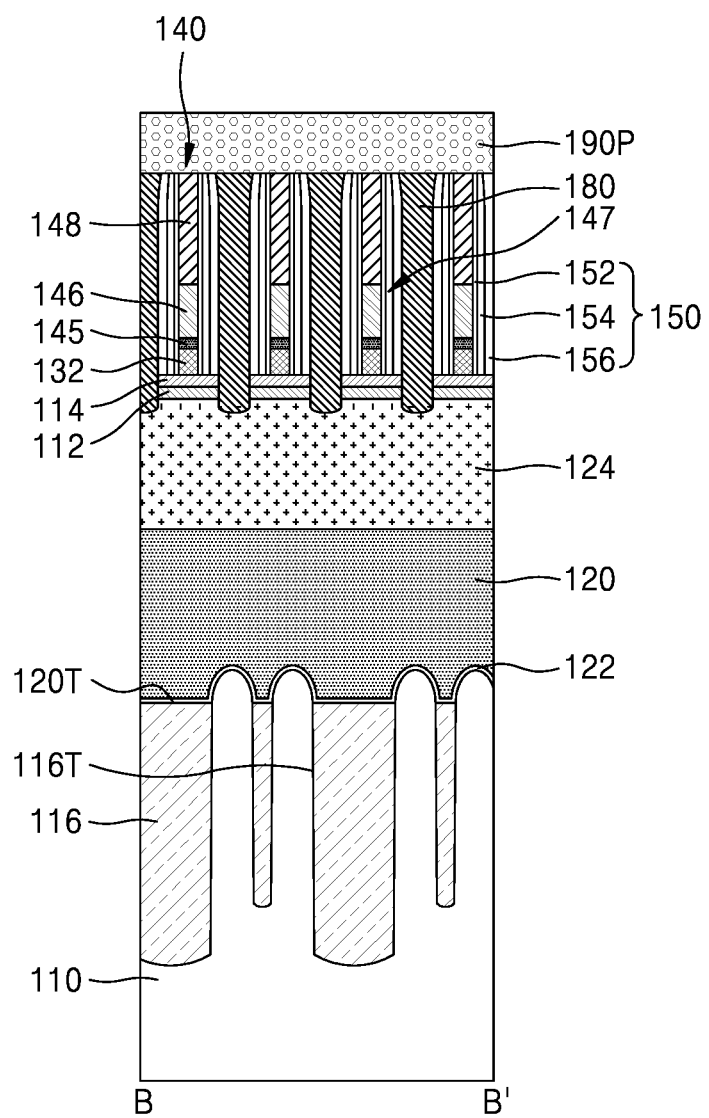
Figure 8C:
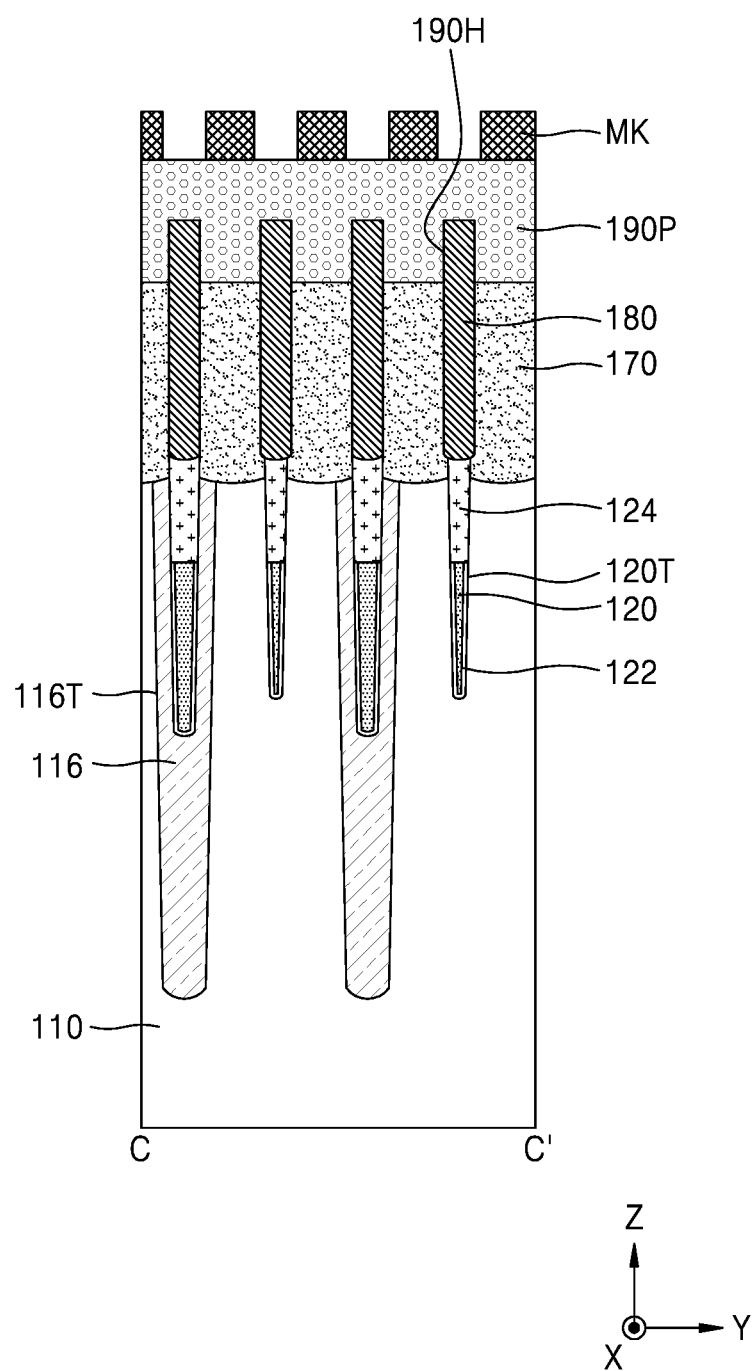
Figure 8D:
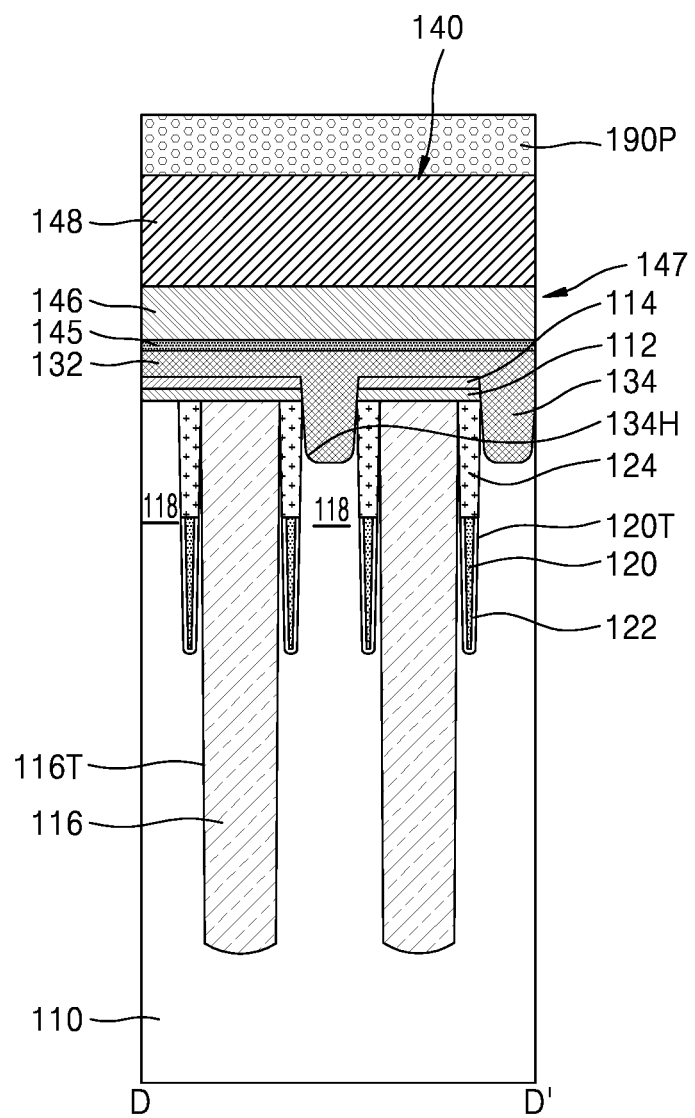
Figure 9A:
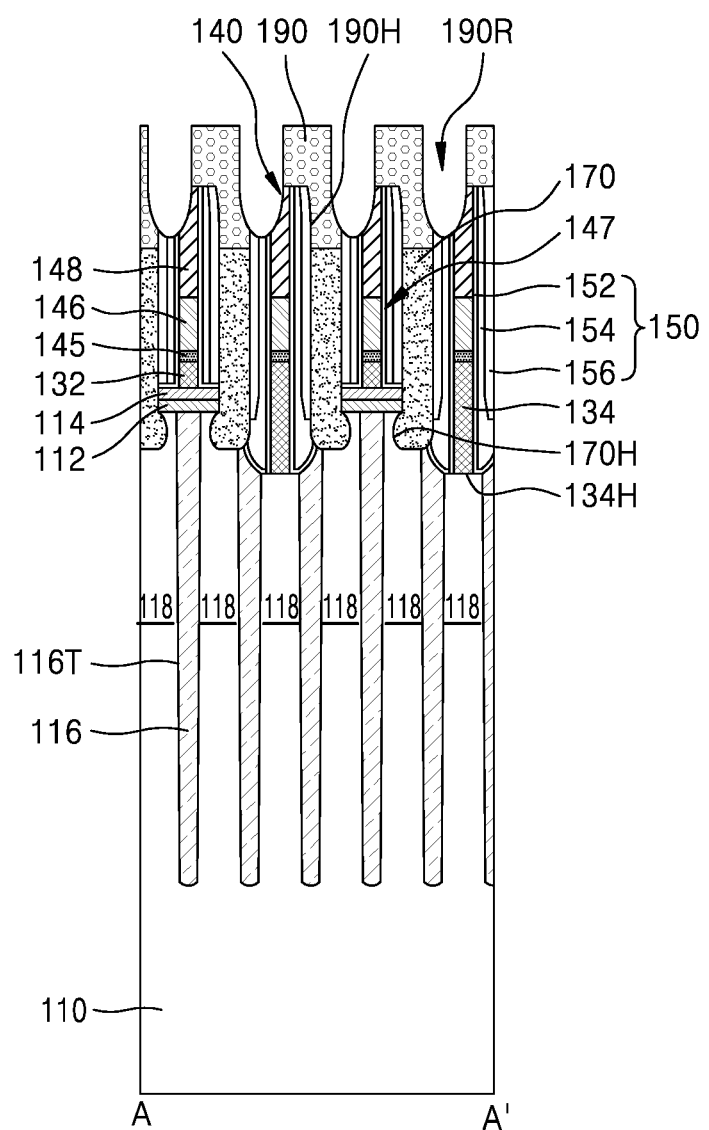
Figure 9B:
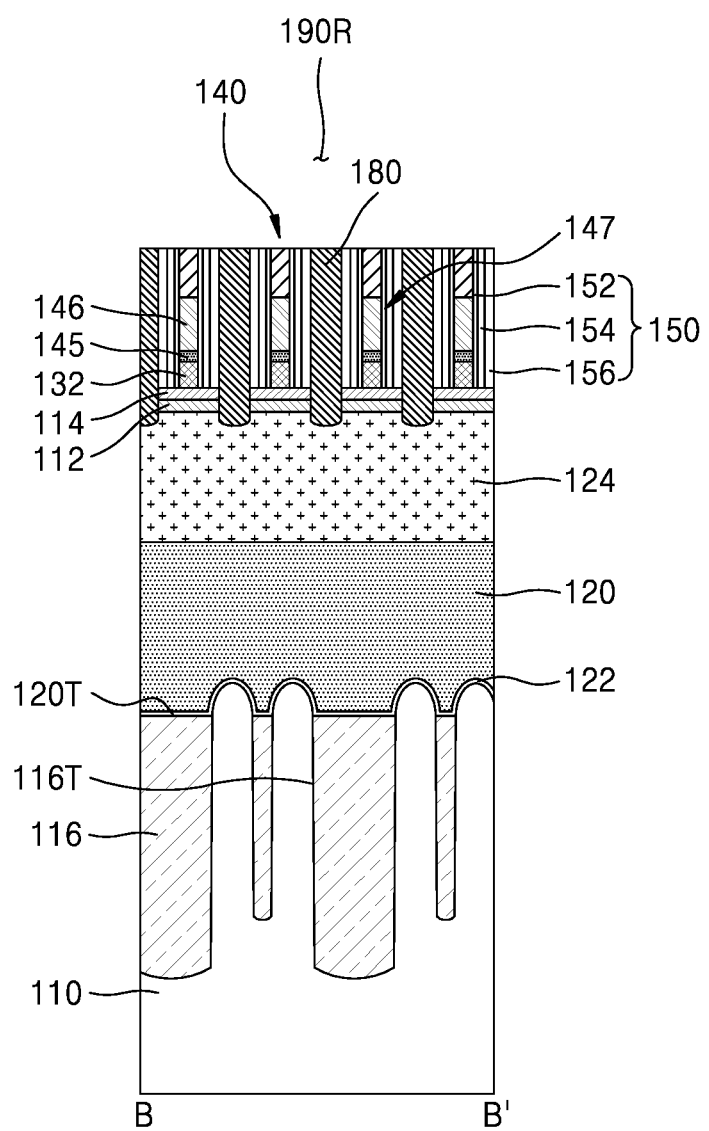
Figure 9C:
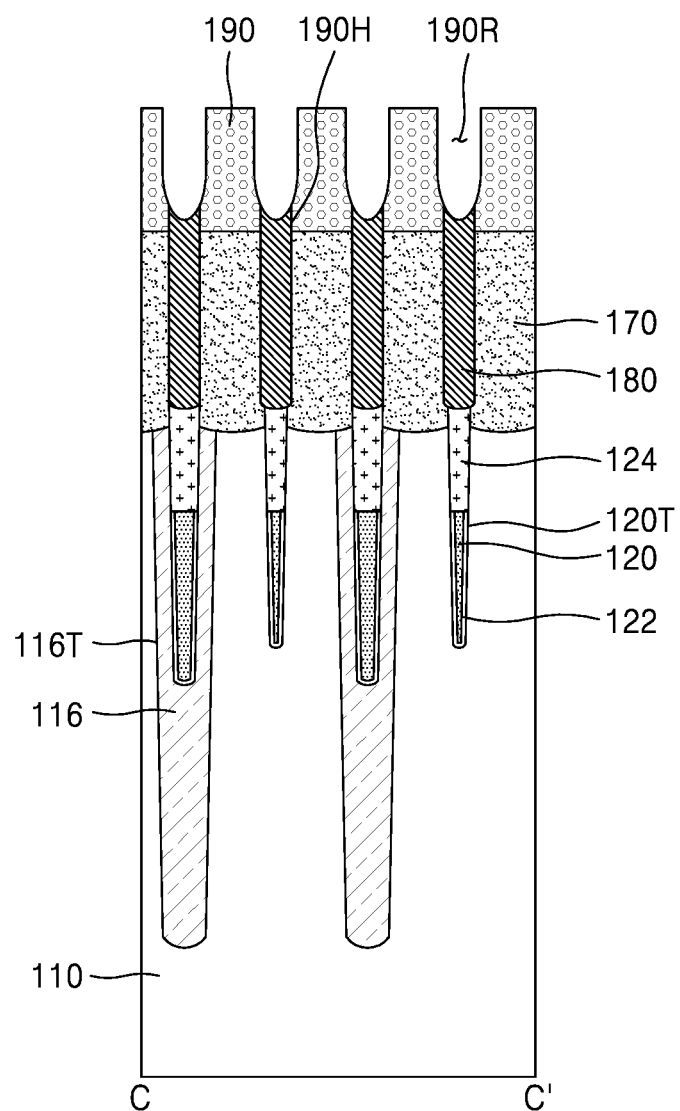
Figure 9D:
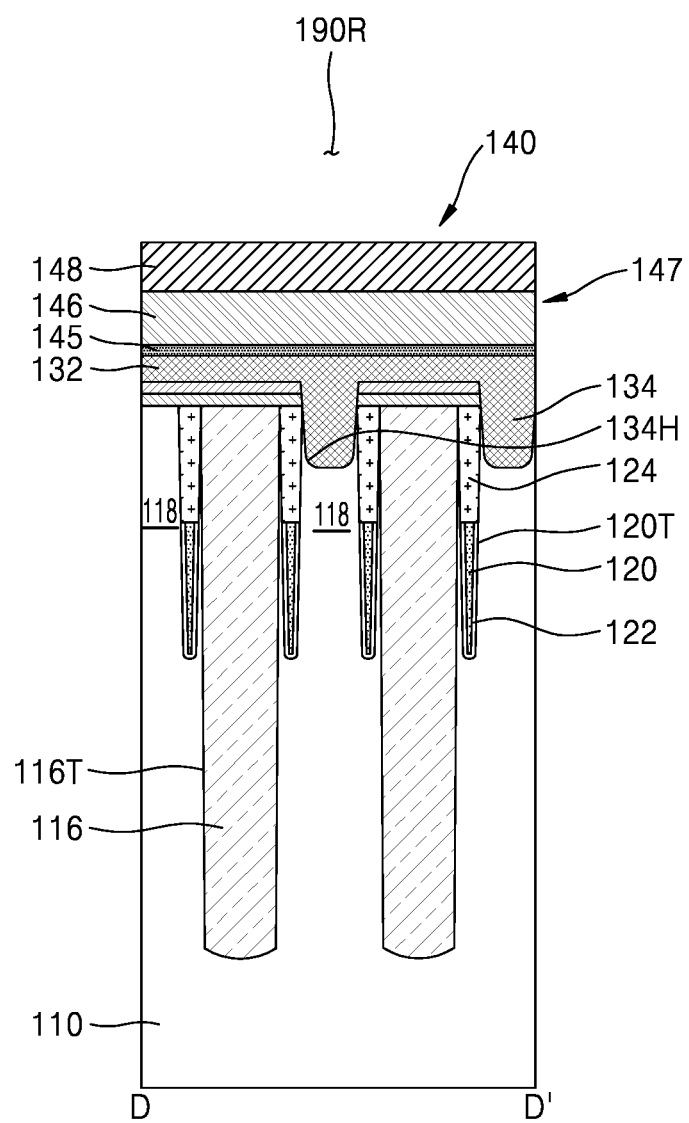

FIGS. 3A to 6D are cross-sectional views of a process sequence of a method of manufacturing a semiconductor memory device, according to an example embodiment. FIG. 7A is a plan view of an operation of forming mask patterns for forming landing pads included in a semiconductor memory device according to an example embodiment. FIG. 7B is a schematic plan layout illustrating the arrangement of the mask patterns shown in FIG. 7A. FIGS. 8A to 10D are cross-sectional views of a process sequence of a method of manufacturing a semiconductor memory device, according to an example embodiment. Specifically, FIGS. 3A, 4A, 5A, 6A, 8A, 9A, and 10A are cross-sectional views taken along a line A-A' of FIG. 1 or FIG. 7A. FIGS. 3B, 4B, 5B, 6B, 8B, 9B, and OB are cross-sectional views taken along a line B-B' of FIG. 1 or FIG. 7A. FIGS. 3C, 4C, 5C, 6C, 8C, 9C, and 10C are cross-sectional views taken along a line C-C' of FIG. 1 or FIG. 7A. FIGS. 3D, 4D, 5D, 6D, 8D, 9D, and 10D are cross-sectional views taken along a line D-D' of FIG. 1 or FIG. 7A.

Referring to FIGS. 3A to 3D, device isolation trenches 116T may be formed in a substrate 110, and device isolation films 116 may be formed to respectively fill the device isolation trenches 116T. A plurality of active regions 118 may be defined in the substrate 110 by the device isolation films 116. Each of the active regions 118 may have a relatively long island shape having a minor axis and a major axis like the active regions ACT shown in FIG. 1.

For example, the substrate 110 may include silicon (Si), for instance, crystalline Si, polycrystalline Si, or amorphous Si. Alternatively, the substrate 110 may include a semiconductor element, such as germanium (Ge) or at least one compound semiconductor selected out of silicon germanium (SiGe), silicon carbide (SiC), gallium arsenide (GaAs), indium arsenide (InAs), and indium phosphide (InP). Alternatively, the substrate 110 may have a silicon on insulator (SOI) structure. For example, the substrate 110 may include a buried oxide layer (BOX). The substrate 110 may include a conductive region, for instance, a doped well or a doped structure.

The device isolation film 116 may include, for example, a material including at least one of a silicon oxide film, a silicon nitride film, and a silicon oxynitride film. The device isolation film 116 may include a single layer including one kind of insulating film, a double layer including two kinds of insulating films, or a multilayered structure including a combination of at least three kinds of insulating films. For example, the device isolation film 116 may include a double layer or a multilayered structure, which includes an oxide film and a nitride film. However, according to the inventive concept, the configuration of the device isolation film 116 is not limited to the above description.

A plurality of word line trenches 120T may be formed in the substrate 110. The plurality of word line trenches 120T may extend in parallel in a first lateral direction (X direction) and have line shapes, which respectively intersect with the active regions 118 and are generally equidistantly arranged in a second lateral direction (Y direction). As shown in a cross-sectional portion taken along the line B-B' of FIG. 3B, steps may be formed in bottoms of the plurality of word line trenches 120T. For example, bumps may be formed above the substrate 110 along the bottoms of the plurality of word line trenches 120T. In some embodiments, during the formation of the plurality of word line trenches 120T, the device isolation film 116 and the substrate 110 may be etched using separate etching processes such that an etched depth of the device isolation film 116 is different from an etched depth of the substrate 110. For example, in the bottoms of the plurality of word line trenches 120T, upper surfaces of the substrate 110 may be higher than upper surfaces of the device isolation film 116. In some embodiments, during the formation of the plurality of word line trenches 120T, the device isolation film 116 and the substrate 110 may be etched together so that the etched depth of the device isolation film 116 may be different from the etched depth of the substrate 110 due to a difference in etch rate between the device isolation film 116 and the substrate 110.

The resultant structure including the plurality of word line trenches 120T may be cleaned, and a plurality of gate dielectric films 122, a plurality of word lines 120, and a plurality of buried insulating films 124 may be then sequentially formed inside the plurality of word line trenches 120T. The plurality of word lines 120 may constitute the plurality of word lines WL shown in FIG. 1.

The plurality of word lines 120 may fill lower portions of the plurality of word line trenches 120T, and the plurality of buried insulating films 124 may cover the plurality of word lines 120 and fill upper portions of the plurality of word line trenches 120T. The plurality of gate dielectric films 122 may be formed between the plurality of word lines 120 and the device isolation film 116 and the substrate 110. Accordingly, the plurality of word lines 120 may extend in parallel in the first lateral direction (X direction) and have line shapes, which respectively intersect with the active regions 118 and are generally equidistantly arranged in the second lateral direction (Y direction). Similarly, the plurality of buried insulating films 124 may extend in parallel in the first lateral direction (X direction) and have line shapes, which respectively intersect with the active regions 118 and are generally equidistantly arranged in the second lateral direction (Y direction).

For example, the plurality of word lines 120 may include titanium (Ti), titanium nitride (TiN), tantalum (Ta), tantalum nitride (TaN), tungsten (W), tungsten nitride (WN), titanium silicon nitride (TiSiN), tungsten silicon nitride (WSiN), or a combination thereof. In some embodiments, each of the plurality of word lines 120 may include a core layer and a barrier layer between the core layer and the gate dielectric film 122. For example, the core layer may include a metal material or a conductive metal nitride, such as W, WN, TiSiN, or WSiN, and the barrier layer may include a metal material or a conductive metal nitride, such as Ti, TiN, Ta, or TaN.

The gate dielectric film 122 may include at least one selected out of a silicon oxide film, a silicon nitride film, a silicon oxynitride film, oxide/nitride/oxide (ONO), and a high-k dielectric film having a higher dielectric constant than the silicon oxide film. For example, the gate dielectric film 122 may have a dielectric constant of about 10 to about 25. In some embodiments, the gate dielectric film 122 may include at least one material selected from hafnium oxide (HD), hafnium silicate (HfSiO), hafnium oxynitride (HON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the gate dielectric film 122 may include $HfD_2$, $Al_2O_3$, $HfAlO_3$, $Ta_2O_3$, or $TiO_2$.

Top surfaces of the plurality of buried insulating films 124 may be at substantially the same level as a top surface of the substrate 110. The buried insulating films 124 may include one material film selected from a silicon oxide film, a silicon nitride film, a silicon oxynitride film, or a combination thereof.

A top surface of each of the plurality of word lines 120 may be at a lower level than the top surface of the substrate 110. Bottom surfaces of the plurality of word lines 120 may have an uneven shape, and saddle fin field-effect transistors (FinFETs) may be formed in the plurality of active regions 118.

As used herein, the term 'level' refers to a height measured in a vertical direction (Z direction) to a main surface of the substrate 110. That is, it will be understood that when two elements are referred to as being located at the same level or a predetermined level, the two elements may have the same height or a predetermined height in the vertical direction (Z direction) to the main surface of the substrate 110. Also, unless otherwise stated, it will be understood that when an element is referred to as being located at a lower/higher level, the element may have a smaller/greater height in the vertical direction (Z direction) relative to the main surface of the substrate 110. As used herein, terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

In some embodiments, after the plurality of word lines 120 are formed, impurity ions may be implanted into portions of the active regions 118 of the substrate 110 on both sides of the plurality of word lines 120, and thus, source regions and drain regions may be formed in the plurality of active regions 118. In some other embodiments, before the plurality of word lines 120 are formed, an ion implantation process for forming source regions and drain regions may be performed.

Referring to FIGS. 4A to 4D, an insulating pattern 112 and 114 may be formed to cover the device isolation film 116, the plurality of active regions 118, and the plurality of buried insulating films 124. For example, the insulating pattern 112 and 114 may include a silicon oxide film, a silicon nitride film, a silicon oxynitride film, a metal-based dielectric film, or a combination thereof.

In some embodiments, the insulating pattern 12 and 114 may include a plurality of insulating films including a first insulating pattern 112 and a second insulating pattern 114, which are stacked (e.g., the second insulating pattern 114 is formed on the first insulating pattern 112). For example, the second insulating pattern 14 may have a higher dielectric constant than the first insulating pattern 12.

In some embodiments, the first insulating pattern 112 may include a silicon oxide film, and the second insulating pattern 114 may include a silicon oxynitride film.

In some other embodiments, the first insulating pattern 12 may include a nonmetal-based dielectric film, and the second insulating pattern 114 may include a metal-based dielectric film. For example, the first insulating pattern 112 may include a silicon oxide film, a silicon nitride film, a silicon oxynitride film, or a combination thereof. For example, the second insulating pattern 114 may include at least one material selected from hafnium oxide (WfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO).

Thereafter, direct contact holes 134H may be formed to pass through the insulating pattern 112 and 114. The direct contact holes 134H may be formed to expose the source regions in the active regions 118. In some embodiments, the direct contact holes 134H may extend into the active regions 118, that is, into the source regions.

Referring to FIGS. 5A to 5D, a direct contact conductive layer may be formed to fill the direct contact holes 134H and cover the insulating pattern 112 and 114. The direct contact conductive layer may include, for example, silicon (Si), germanium (Ge), tungsten (W), tungsten nitride (WN), cobalt (Co), nickel (Ni), aluminum (Al), molybdenum (Mo), ruthenium (Ru), titanium (Ti), titanium nitride (TiN), tantalum (Ta), tantalum nitride (TaN), copper (Cu), or a combination thereof. In some embodiments, the direct contact conductive layer may include an epitaxial silicon layer. In some embodiments, the direct contact conductive layer may include doped polysilicon.

Thereafter, a metal-based conductive layer and an insulating capping layer may be sequentially formed to cover the insulating pattern 12 and 114 and the direct contact conductive layer and cover a bit line structure 140.

In some embodiments, the metal-based conductive layer may have a stack structure of a first metal-based conductive layer and a second metal-based conductive layer. The metal-based conductive layer may have, for example, a stack structure of two layers, but the inventive concept is not limited thereto. For example, the metal-based conductive layer may include a single layer or a stack structure of at least three layers.

In some embodiments, the first metal-based conductive layer may include titanium nitride (TiN) or Ti—Si—N (TSN), and the second metal-based conductive layer may include tungsten (W) or include tungsten and tungsten silicide (WSix). In some embodiments, the first metal-based conductive layer may function as a diffusion barrier. In some embodiments, the insulating capping layer may include a silicon nitride film.

The first metal-based conductive layer, the second metal-based conductive layer, and the insulating capping layer may be etched, thereby forming a plurality of bit lines 147 and a plurality of insulating capping lines 148. Each of the plurality of bit lines 147 may include a first metal-based conductive pattern 145 and a second metal-based conductive pattern 146, each of which have line shapes. Side surfaces of the first metal-based conductive pattern 145, the second metal-based conductive pattern 146, and the plurality of insulating capping lines 148 may be aligned with one another. One bit line 147 and one insulating capping line 148 covering the one bit line 147 may constitute one bit line structure 140.

In some embodiments, the bit line structure 140 may further include a conductive semiconductor pattern 132, which is arranged between the insulating pattern 112 and 114 and the first metal-based conductive pattern 145. The conductive semiconductor pattern 132 may include doped polysilicon. In some embodiments, the conductive semiconductor pattern 132 may not be formed but may be omitted.

The plurality of bit line structures 140 including the plurality of bit lines 147 and the plurality of insulating capping lines 148 may extend in parallel in the second lateral direction (Y direction) parallel to the main surface of the substrate 110. The plurality of bit lines 147 may constitute the plurality of bit lines BL shown in FIG. 1.

During the etching process for forming the plurality of bit lines 147, portions of the direct contact conductive layer, which do not vertically overlap the bit lines 147, may be removed together using the etching process to form a plurality of direct contact conductive patterns 134. In this case, the insulating pattern 112 and 114 may function as an etch stop film during an etching process of forming the plurality of bit lines 147 and the plurality of direct contact conductive patterns 134. The plurality of direct contact conductive patterns 134 may constitute the plurality of direct contacts DC shown in FIG. 1. The plurality of bit lines 147 may be electrically connected to the plurality of active regions 118 through the plurality of direct contact conductive patterns 134.

In some embodiments, the conductive semiconductor pattern 132 may be formed together during the process of removing the portions of the direct contact conductive layer to form the direct contact conductive pattern 134. For example, from among a portion of the direct contact conductive layer that vertically overlaps the bit line 147, the conductive semiconductor pattern 132 may be a portion located on the insulating pattern 112 and 114 without vertically overlapping the direct contact hole 134H, while the direct contact conductive pattern 134 may be a portion vertically overlapping the direct contact hole 134H while being in contact with the active region 118.

Both sidewalls of the plurality of bit line structures 140 may be covered by a plurality of insulating spacer structures 150. Each of the plurality of insulating spacer structures 150 may include first insulating spacers 152, second insulating spacers 154, and third insulating spacers 156. The second insulating spacers 154 may include a material having a lower dielectric constant than the first insulating spacers 152 and the third insulating spacers 156. In some embodiments, the first insulating spacers 152 and the third insulating spacers 156 may include a nitride film, and the second insulating spacers 154 may include an oxide film. In some embodiments, the first insulating spacers 152 and the third insulating spacers 156 may include a nitride film, and the second insulating spacers 154 may include a material having an etch selectivity with respect to the first insulating spacers 152 and the third insulating spacers 156. For example, when the first insulating spacers 152 and the third insulating spacers 156 include a nitride film, the second insulating spacers 154 may include an oxide film. The second insulating spacers 154 may be removed during a subsequent process to form air spacers.

A plurality of buried contact holes 170H may be formed between the plurality of bit lines 147. An inner space of each of the plurality of buried contact holes 170H may be defined by the active region 118 and the insulating spacer structure 150 covering a sidewall of each of two adjacent ones of the plurality of bit lines 147 between the two adjacent bit lines 147.

The plurality of buried contact holes 170H may be formed by removing portions of the insulating pattern 112 and 114 and the active regions 118 by using the insulating spacer structures 150 covering both sidewalls of each of the plurality of insulating capping lines 148 and the plurality of bit line structures 140 as an etch mask. The formation of the plurality of buried contact holes 170H may include performing an anisotropic etching process for removing the portions of the insulating pattern 112 and 114 and the active regions 118 by using the insulating spacer structures 150 covering both sidewalls of each of the plurality of insulating capping lines 148 and the plurality of bit line structures 140 as an etch mask and then performing an isotropic etching process for further removing other portions of the active regions 118 to expand spaces defined by the active regions 118.

Referring to FIGS. 6A to 6D, a plurality of buried contacts 170 and a plurality of insulating fences 180 may be formed in spaces between the plurality of insulating spacer structures 150 covering both sidewalls of the respective bit line structures 140. The plurality of buried contacts 170 and the plurality of insulating fences 180 may be alternately located along a space between a pair of insulating spacer structures 150 out of the plurality of insulating spacer structures 150 covering both sidewalls of the plurality of bit line structures 140, namely, in the second lateral direction (Y direction).

For example, the plurality of buried contacts 170 may include polysilicon. For instance, the plurality of insulating fences 180 may include a nitride film.

In some embodiments, the plurality of buried contacts 170 may be arranged in a line in each of the first lateral direction (X direction) and the second lateral direction (Y direction). Each of the plurality of buried contacts 170 may extend from the active regions 118 in the vertical direction (Z direction) perpendicular to the substrate 110. The plurality of buried contacts 170 may constitute the plurality of buried contacts BC shown in FIG. 1.

The plurality of buried contacts 170 may be arranged in spaces defined by the plurality of insulating spacer structures 150 covering both sidewalls of the plurality of insulating fences 180 and the plurality of bit line structures 140.

The formation of the plurality of buried contacts 170 may include forming a preliminary buried contact material layer to fill the plurality of buried contact holes 170H and removing upper portions of the preliminary buried contact material layer. For example, the preliminary buried contact material layer may include polysilicon.

Top surfaces of the plurality of buried contacts 170 may be at a lower level than top surfaces of the plurality of insulating capping lines 148. Top surfaces of a plurality of insulating fences 180 may be at the same level as the top surfaces of the insulating capping lines 148 in the vertical direction (Z direction). Accordingly, the top surfaces of the plurality of buried contacts 170 may be at a lower level than the top surfaces of the plurality of insulating fences 180.

A plurality of landing pad holes 190H may be defined by the plurality of insulating spacer structures 150 and the plurality of insulating fences 180. The plurality of buried contacts 170 may be exposed at bottoms of the plurality of landing pad holes 190H.

In some embodiments, after the plurality of insulating fences 180 are formed, the preliminary buried contact material layer may be formed. In some other embodiments, after the preliminary buried contact material layer is formed, the plurality of insulating fences 180 may be formed. In some other embodiments, after the plurality of insulating fences 180 are formed, the plurality of buried contact holes 170H described with reference to FIGS. 5A to 5D may be formed, and the preliminary buried contact material layer may be formed to fill the plurality of buried contact holes 170H.

The plurality of buried contacts 170 may fill lower portions of spaces between the plurality of insulating spacer structures 150 covering both sidewalls of the respective bit line structures 140. In some embodiments, the top surfaces of the plurality of buried contacts 170 may be formed at a level equal to or higher than a level of top surfaces of the bit lines 147, but the inventive concept is not limited thereto.

During the formation of the plurality of buried contacts 170, upper portions of the insulating capping line 148 and the insulating spacer structure 150 that are included in the bit line structure 140 may be removed, and thus, a level of a top surface of the bit line structure 140 may be lowered.

Referring to FIGS. 7A to 8D, a landing pad material layer 190P may be formed to fill the plurality of landing pad holes 190H and cover the plurality of bit line structures 140, and a plurality of mask patterns MK may be formed on the landing pad material layer 190P.

In some embodiments, before the landing pad material layer 190P is formed, a metal silicide film may be formed on the plurality of buried contacts 170. The metal silicide film may be between the plurality of buried contacts 170 and the landing pad material layer 190P. The metal silicide film may include cobalt silicide (CoSix), nickel silicide (NiSix), or manganese silicide (MnSix), but is not limited thereto.

In some embodiments, the landing pad material layer 190P may include a conductive barrier film and a conductive pad material layer located on the conductive barrier film. For example, the conductive barrier film may include a metal, a conductive metal nitride, or a combination thereof. In some embodiments, the conductive barrier film may have a Ti/TiN stack structure. For instance, the conductive pad material layer may include a metal. In some embodiments, the conductive pad material layer may include tungsten (W).

The plurality of mask patterns MK may be formed using, for example, an EUV lithography process. In some embodiments, the plurality of mask patterns MK may be formed without using a pattern density-increasing technique including one photolithography process, such as DPT or QPT. A top surface of each of the plurality of mask patterns MK may be formed in a disc shape of which edges are not elliptical but substantially circular, when viewed top down, but the inventive concept is not limited thereto. For example, the top surface of each of the plurality of mask patterns MK may have a modified shape of a disc shape of which edges are substantially circular, by using an optical proximity correction (OPC) method, such that a top surface of each of a plurality of landing pads (e.g., landing pads 190 in FIGS. 9A and 9C), which are the resultant structures obtained by etching the landing pad material layer 190P using the plurality of mask patterns MK as an etch mask, has a disc shape of which edges are not elliptical but substantially circular, when viewed top down. A side surface at the edge of each of the plurality of mask patterns MK may be substantially perpendicular to a top surface of the landing pad material layer 190P.

The plurality of mask patterns MK may have a hexagonal array structure. For example, the plurality of mask patterns MK may be arranged in a line in a first lateral direction (X direction) and arranged in zigzag in a second lateral direction (Y direction) to form a honeycomb shape.

The mask patterns MK and imaginary reference mask patterns MKR are illustrated together in FIG. 7B in order to explain the arrangement of the plurality of mask patterns MK. In a plurality of reference mask patterns MKR, central points MKR-C of three adjacent reference mask patterns MKR may be connected by an isosceles triangle or an equilateral triangle. A diameter DI-MR of the reference mask pattern MKR may be equal to a diameter DI-M of the mask pattern MK. In some embodiments, the plurality of reference mask patterns MKR may be formed using a pattern density-increasing technique including one photolithography process, such as DPT or QPT.

For example, since three interior angles of a triangle connecting the central points MKR-C of the three adjacent reference mask patterns MKR are substantially the same as the first reference interior angle $\theta 1$-R, the second reference interior angle $\theta 2$-R, and the third reference interior angle $\theta 3$-R, which are described with reference to FIG. 2A, a detailed description thereof will be omitted. The first reference interior angle $\theta 1$-R may be equal to the second reference interior angle $\theta 2$-R. In some embodiments, the third reference interior angle $\theta 3$-R may be equal to each of the first reference interior angle $\theta 1$-R and the second reference interior angle $\theta 2$-R. For example, each of the first reference interior angle $\theta 1$-R, the second reference interior angle $\theta 2$-R, and the third reference interior angle $\theta 3$-R may be 60°.

Since distances between the respective central points MKR-C of the three adjacent reference mask patterns MKR are substantially the same as the reference base distance LB-R, the first reference side distance LS-R1, and the second reference side distance LS-R2, which are shown in FIG. 2, a detailed description thereof will be omitted.

In three mask patterns MK, which are adjacent to each other, from among the plurality of mask patterns MK, for example, respective central points MK-C of two mask patterns MK, which are adjacent to each other in the first lateral direction (X direction), and a central point MK-C of one mask pattern MK, which is adjacent to the two adjacent mask patterns MK in the second lateral direction (Y direction), may be connected by a scalene triangle.

From among the plurality of mask patterns MK, three adjacent mask patterns MK corresponding respectively to the first landing pad LP1, the second landing pad LP2, and the third landing pad LP3 described with reference to FIG. 2A may be referred to as a first mask pattern MK1, a second mask pattern MK2, and a third mask pattern MK3, respectively.

Three interior angles of a triangle connecting the respective central points MK-C of the first mask pattern MK1, the second mask pattern MK2, and the third mask pattern MK3 may be respectively different from one another. Since the three interior angles of the triangle connecting the respective central points MK-C of the first mask pattern MK1, the second mask pattern MK2, and the third mask pattern MK3 are substantially the same as the first interior angle $\theta 1$, the second interior angle $\theta 2$, and the third interior angle $\theta 3$ described with reference to FIG. 2A, a detailed description thereof will be omitted. For example, the first interior angle $\theta 1$, the second interior angle $\theta 2$, and the third interior angle $\theta 3$ may be respectively different from one another. The first interior angle $\theta 1$ and the second interior angle $\theta 2$ may have different values. For example, the first interior angle $\theta 1$ may be greater than 60°, and the second interior angle $\theta 2$ may be less than 60°. The third interior angle $\theta 3$ may have a value obtained by subtracting the first interior angle $\theta 1$ and the second interior angle $\theta 2$ from 180°.

Distances between the respective central points MK-C of the first mask pattern MK1, the second mask pattern MK2, and the third mask pattern MK3 may be substantially the same as the base distance LB, the first side distance LS1, and the second side distance LS2, which are shown in FIG. 2A. The base distance LB may be equal to the reference base distance LB-R. For example, the base distance LB may have a value of 3F. The first side distance LS1 may be different from the second side distance LS2. In some embodiments, the first side distance LS1 may be less than the base distance LB, and the second side distance LS2 may be greater than the base distance LB. For example, the first side distance LS1 may be less than 3F, and the second side distance LS2 may be greater than 3F.

The plurality of mask patterns MK may be arranged in a line in the first lateral direction (X direction) and arranged in zigzag in the second lateral direction (Y direction).

The central point MK-C of each of the plurality of mask patterns MK may be shifted from the central point MKR-C of each of the plurality of reference mask patterns MKR in the first lateral direction (X direction) or a direction (-X direction) opposite to the first lateral direction (X direction) in a direction away from a bit line BL adjacent thereto.

For example, the central point MK-C of each of the mask patterns MK, which are arranged in one row in the first lateral direction (X direction), may be shifted from the central point MKR-C of each of the reference mask patterns MKR, which are arranged in one row in the first lateral direction (X direction), by a first travel distance CD1 in the first lateral direction (X direction). The central point MK-C of each of the mask patterns MK, which are adjacent to each other in the second lateral direction (Y direction) and arranged in another line in the first lateral direction (X direction), may be shifted from the central point MKR-C of each of the reference mask patterns MKR, which are arranged in one line in the first lateral direction (X direction), by a second travel distance CD2 in the direction (-X direction) opposite to the first lateral direction (X direction). In some embodiments, the first travel distance CD1 may be equal to the second travel distance CD2. For example, each of the first travel distance CD1 and the second travel distance CD2 may be greater than 0 and less than 0.75F. In some embodiments, each of the first travel distance CD1 and the second travel distance CD2 may range from about 1 nm to about 6 nm.

The plurality of mask patterns MK may be formed using, for example, an EUV lithography process. In some embodiments, the plurality of mask patterns MK may be formed without using a pattern density-increasing technique including one photolithography process, such as DPT or QPT.

Accordingly, unlike the plurality of reference mask patterns MKR arranged to have a complete honeycomb shape, the plurality of mask pattern MK may be formed to have a distorted honeycomb shape.

Referring to FIGS. 9A to 9D, a plurality of landing pads 190 may be formed to fill at least portions of the plurality of landing pad holes 190H and extend on the plurality of bit line structures 140. The plurality of landing pads 190 may be located on the plurality of buried contacts 170 and extend on the plurality of bit line structures 140. In some embodiments, the plurality of landing pads 190 may extend on the plurality of bit lines 147. The plurality of landing pads 190 may be located on the plurality of buried contacts 170, and thus, the plurality of buried contacts 170 may be electrically connected to the plurality of landing pads 190 corresponding thereto. The plurality of landing pads 190 may be connected to the active regions 118 through the plurality of buried contacts 170. The plurality of landing pads 190 may constitute the plurality of landing pads LP shown in FIG. 1.

One buried contact 170 and one landing pad 190 located on the buried contact 170 together may be referred to as a contact structure. The buried contact 170 included in the contact structure may be between two bit line structures 140, which are adjacent to each other. The landing pad 190 may extend from a space between two bit line structures 140, which are adjacent to each other with the buried contact 170 therebetween, onto one bit line structure 140. That is, the landing pad 190 may be electrically connected to the buried contact 170 and extend from the space between the two bit line structures 140, which are adjacent to each other with the buried contact 170 therebetween, onto the one bit line structure 140 to vertically overlap the one bit line structure 140.

The formation of the plurality of landing pads 190 may include forming the landing pad material layer 190P shown in FIGS. 7A to 8D, forming recess units 190R using the plurality of mask patterns MK as an etch mask, and separating the landing pad material layer 190P into the plurality of landing pads 190 to respectively correspond to the plurality of buried contacts 170. The plurality of landing pads 190 may be spaced apart from each other with the recess units 190R therebetween. An upper end of the insulating spacer structure 150, an upper end of the insulating capping line 148, and an upper end of the insulating fence 180 may be exposed inside the recess unit 190R. In some embodiments, during the formation of the recess unit 190R, a portion of the landing pad material layer 190P, upper portions of the plurality of insulating spacer structures 150, upper portions of the plurality of insulating capping lines 148, and upper portions of the plurality of insulating fences 180 may be removed together.

Referring to FIGS. 10A to 10D, a plurality of lower electrodes 210, a capacitor dielectric film 220, and an upper electrode 230 may be sequentially formed on the plurality of landing pads 190, and thus, a semiconductor memory device 1 including a plurality of capacitor structures 200 may be formed. The plurality of lower electrodes 210 may be electrically connected to the plurality of landing pads 190 to respectively correspond to the plurality of landing pads 190. The capacitor dielectric film 220 may conformally cover the plurality of lower electrodes 210. The upper electrode 230 may cover the capacitor dielectric film 220. The upper electrode 230 may be formed opposite to the lower electrode 210 with the capacitor dielectric film 220 therebetween. Each of the capacitor dielectric film 220 and the upper electrode 230 may be integrally formed to cover the plurality of lower electrodes 210 in a predetermined region, for example, in one memory cell region CR. The plurality of lower electrodes 210 may constitute the plurality of storage nodes SN shown in FIG. 1.

Each of the plurality of lower electrodes 210 may have a pillar shape of which the inside is filled to have a circular horizontal cross-section, but is not limited thereto. In some embodiments, each of the plurality of lower electrodes 210 may have a cylindrical shape of which a bottom is blocked. In some embodiments, the plurality of lower electrodes 210 may be arranged in zigzag in the first lateral direction (X direction) or the second lateral direction (Y direction) to form a honeycomb shape. In some other embodiments, the plurality of lower electrodes 210 may be arranged in a line in each of the first lateral direction (X direction) and the second lateral direction (Y direction) to form a matrix shape. The plurality of lower electrodes 210 may include, for example, doped silicon, a metal such as tungsten or copper, or a conductive metal compound such as titanium nitride. Although not separately shown, the semiconductor memory device 1 may further include at least one support pattern in contact with sidewalls of the plurality of lower electrodes 210.

The capacitor dielectric film 220 may include, for example, TaO, TaAlO, TaON, AlO, AlSiO, HfO, HfSiO, ZrO, ZrSiO, TiO, TiAlO, BST((Ba,Sr)TiO), STO(SrTiO), BTO(BaTiO), PZT(Pb(Zr,Ti)O), (Pb,La)(Zr,Ti)O, Ba(Zr,Ti)O, Sr(Zr,Ti)O, or a combination thereof.

The upper electrode 230 may include, for example, doped silicon, Ru, RuO, Pt, PtO, Ir, IrO, SRO(SrRuO), BSRO((Ba, Sr)RuO), CRO(CaRuO), BaRuO, La(Sr,Co)O, Ti, TiN, W, WN, Ta, TaN, TiAlN, TiSiN, TaAlN, TaSiN, or a combination thereof.

Figure 10A:
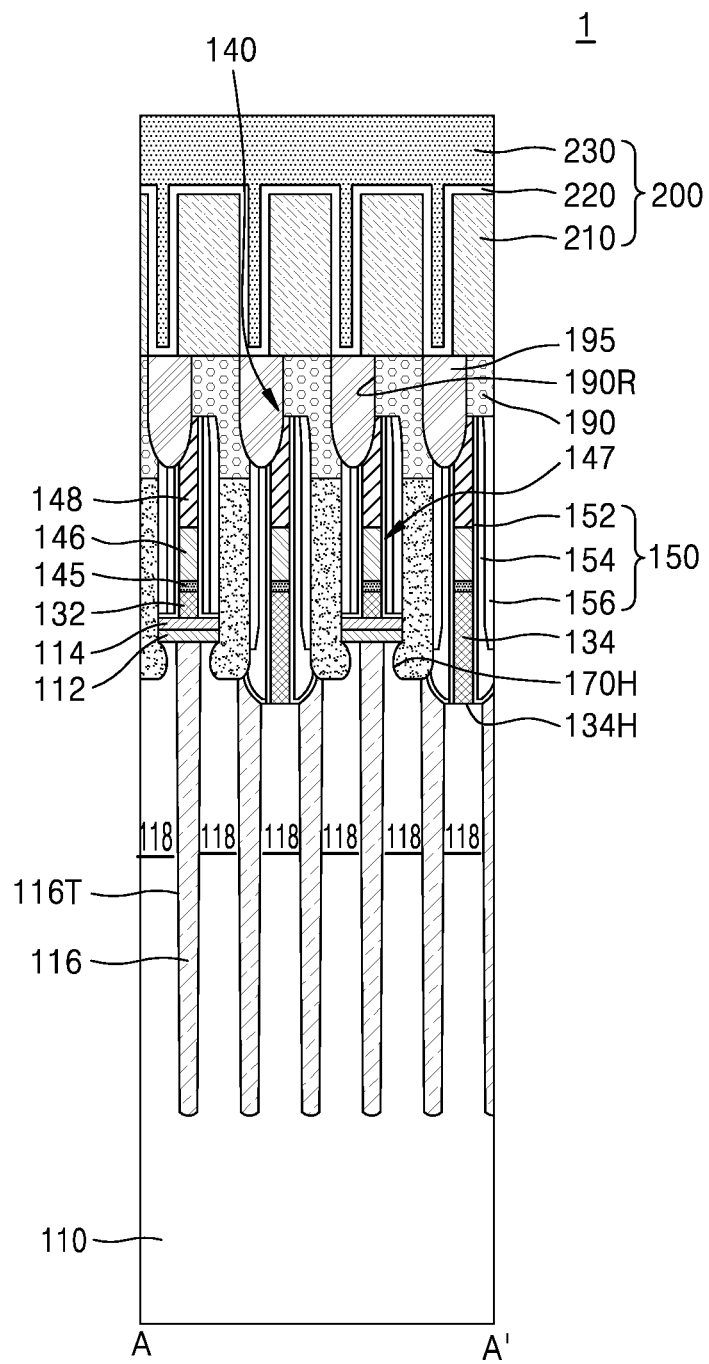
Figure 10B:
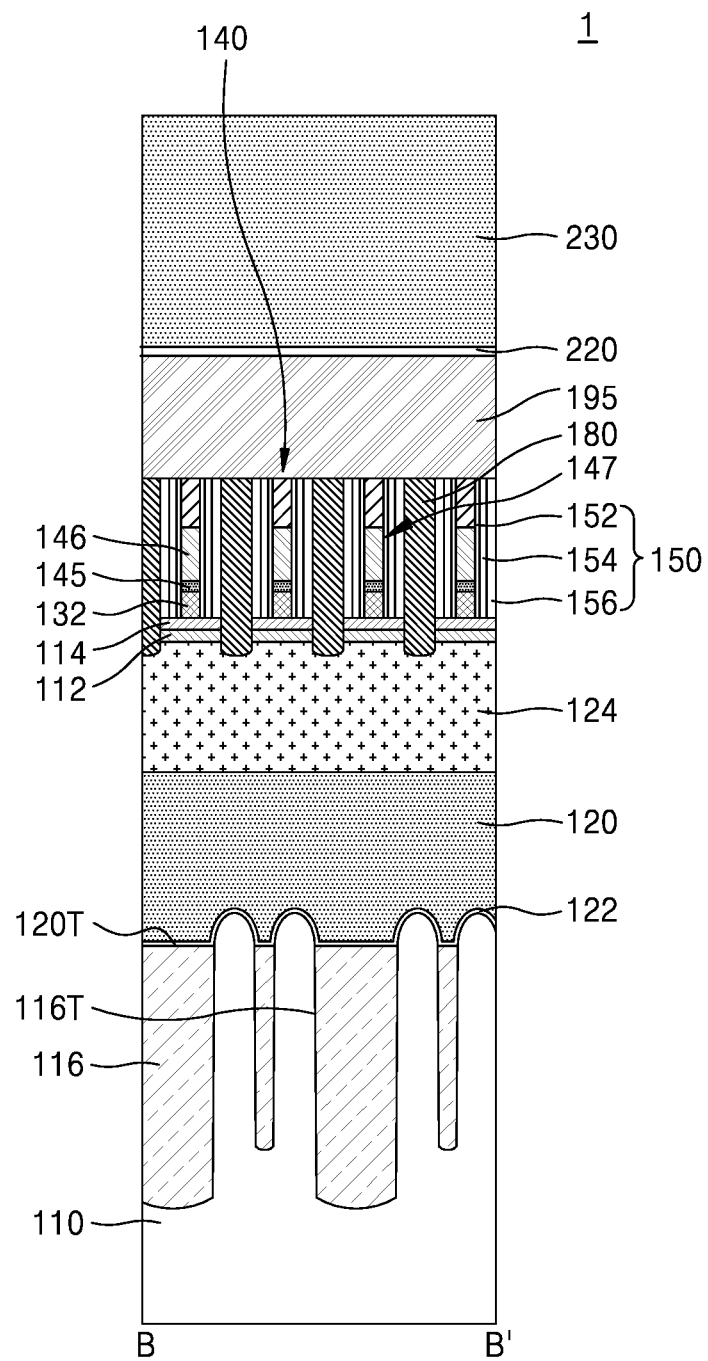
Figure 10C:
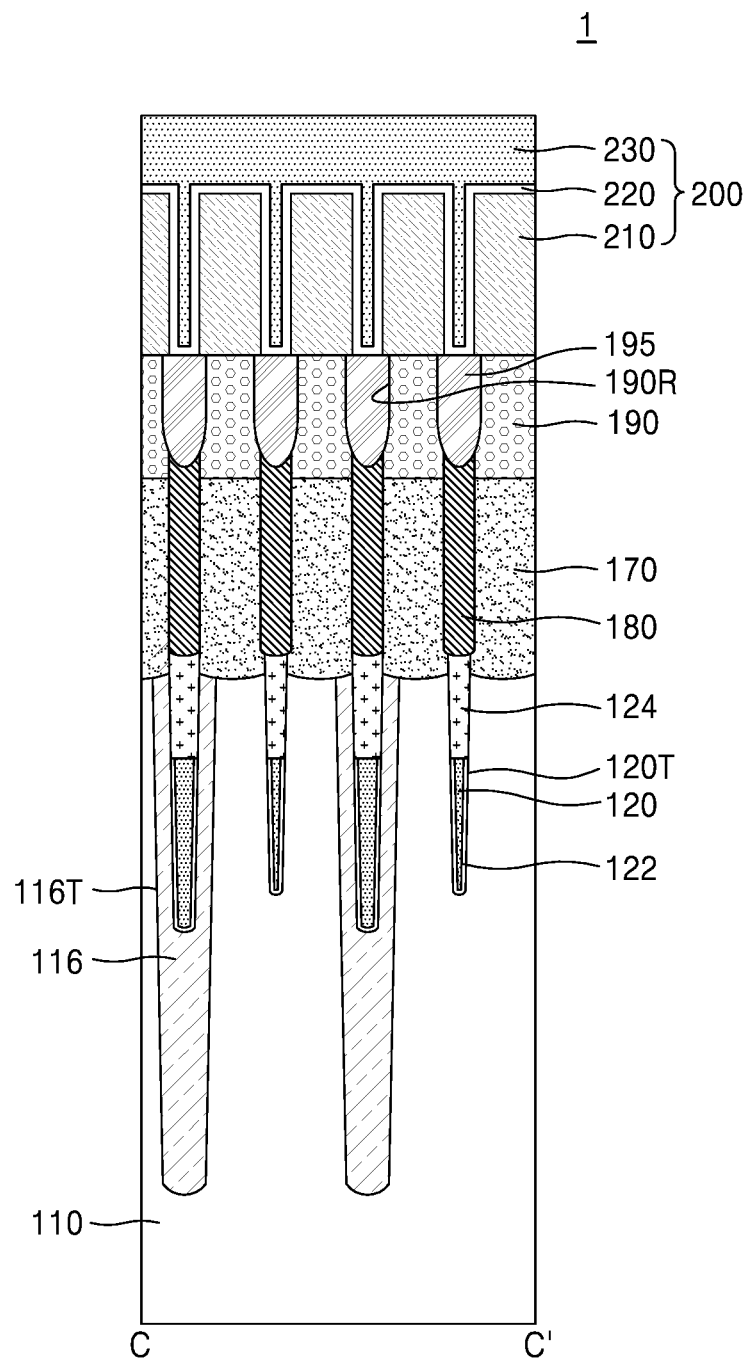
Figure 10D:
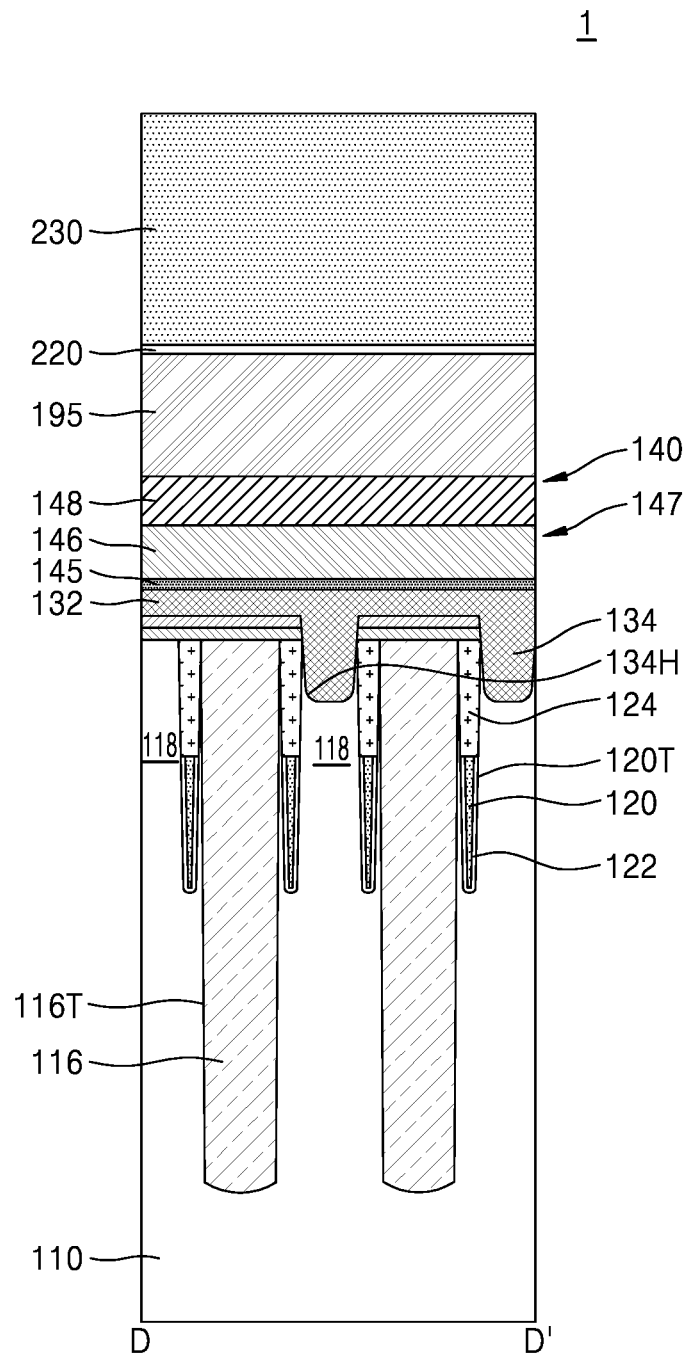

Before the plurality of capacitor structures 200 are formed, insulating structures 195 may be formed to fill the recess units 190R. In some embodiments, upper surfaces of the insulating structures 195 may be coplanar with upper surfaces of the landing pads 190 and may contact bottom surfaces of the capacitor dielectric film 220. In some embodiments, the insulating structures 195 may include an interlayer insulating layer and an etch stop film. For example, the interlayer insulating layer may include an oxide film, and the etch stop film may include a nitride film. Although FIGS. 10A and 10C illustrate a case in which a top surface of the insulating structure 195 is at the same level as a bottom surface of the lower electrode 210, the inventive concept is not limited thereto. For example, the top surface of the insulating structure 195 may be at a higher level than the bottom surface of the lower electrode 210, and the lower electrode 210 may extend into the insulating structure 195 toward the substrate 110.

Since the semiconductor memory device 1 according to the present embodiment is formed by shifting the central point of each of the plurality of landing pads 190 in a direction away from the bit line structure 140 adjacent thereto, widths (in the first lateral direction (X direction)) of the plurality of landing pads 190 extending in the vertical direction (Z direction) along side surfaces of the adjacent bit line structure 140 may be increased. Accordingly, an overlap margin between the landing pad 190 and the buried contact 170, which correspond to each other, may be increased, thereby improving the reliability of electrical connection between the landing pad 190 and the buried contact 170, which correspond to each other. Also, since a distance (in the first lateral direction (X direction)) between one landing pad 190 and a buried contact 170 connected to another landing pad 190 adjacent to the landing pad 190 is increased, the occurrence of a bridge between the landing pad 190 and the buried contact 170 connected to the other landing pad 190 adjacent to the landing pad 190 may be prevented.

In addition, a top surface of each of the plurality of landing pads 190 may have a disc shape of which edges are not elliptical but substantially circular. Accordingly, since a distance between the respective landing pads 190 is increased, the occurrence of a bridge between adjacent landing pads 190 may be prevented, and gap-fill characteristics of the insulating structure 195 filling a space between the respective landing pads 190 may be improved. Therefore, the reliability of electrical insulation between the respective landing pads 190 may be improved.

While the inventive concept has been particularly shown and described with reference to embodiments thereof, it will be understood that various changes in form and details may be made therein without departing from the spirit and scope of the following claims.

What is claimed is:

1. A semiconductor memory device comprising:
 a plurality of bit line structures comprising bit lines extending in parallel in a first lateral direction on a substrate; and
 a plurality of buried contacts and a plurality of landing pads, the plurality of buried contacts filling lower portions of spaces between the plurality of bit line structures on the substrate, the plurality of landing pads filling upper portions of the spaces between the plurality of bit line structures and extending on the plurality of bit line structures,
 wherein the plurality of landing pads have a hexagonal array structure, and central points of respective top surfaces of a first landing pad, a second landing pad, and a third landing pad, which are adjacent to each other from among the plurality of landing pads, are connected by a scalene triangle.

2. The semiconductor memory device of claim 1, wherein the plurality of landing pads are arranged in a line in a second lateral direction perpendicular to the first lateral direction and arranged in zigzag in the first lateral direction.

3. The semiconductor memory device of claim 1,
 wherein the first landing pad and the second landing pad are arranged in a second lateral direction perpendicular to the first lateral direction,
 wherein a first interior angle between two sides connecting the central point of the top surface of the first landing pad with the central point of the top surface of the second landing pad and the central point of the top surface of the third landing pad is different from a second interior angle between two sides connecting the central point of the top surface of the second landing pad with the central point of the top surface of the first landing pad and the central point of the top surface of the third landing pad.

4. The semiconductor memory device of claim 3, wherein the first interior angle is greater than 60°, and the second interior angle is less than 60°.

5. The semiconductor memory device of claim 1,
wherein the central point of the top surface of the third landing pad is located apart from a central extension line in a second lateral direction perpendicular to the first lateral direction, and
wherein the central extension line extends in the first lateral direction from a center of a side connecting the central points of the respective top surfaces of the first landing pad and the second landing pad.

6. The semiconductor memory device of claim 5,
wherein a distance between the central points of the respective top surfaces of the first landing pad and the second landing pad is 3F, and the central point of the top surface of the third landing pad is located apart from the central extension line in the second lateral direction by a distance of between 0 and 1.5F, and
wherein F represents a feature size.

7. The semiconductor memory device of claim 5, wherein the central point of the top surface of the third landing pad is located apart from the central extension line by a distance of 2 nm to 12 nm in the second lateral direction.

8. The semiconductor memory device of claim 5, wherein a distance between the central points of the respective top surfaces of the first landing pad and the third landing pad is less than 3F, and a distance between the central points of the respective top surfaces of the second landing pad and the third landing pad is greater than 3F.

9. The semiconductor memory device of claim 1, wherein a top surface of each of the plurality of landing pads has a disc shape.

10. The semiconductor memory device of claim 1, further comprising:
a plurality of storage nodes on the plurality of landing pads,
wherein the plurality of storage nodes have a hexagonal array structure, and central points of respective top surfaces of a first storage node, a second storage node, and a third storage node, which are adjacent to each other from among the plurality of storage nodes, are connected by an equilateral triangle.

11. A semiconductor memory device comprising:
a substrate in which a plurality of active regions are defined:
a plurality of word lines intersecting with the plurality of active regions and extending in parallel in a first lateral direction:
a plurality of bit line structures comprising bit lines on the substrate, the bit lines extending in parallel in a second lateral direction perpendicular to the first lateral direction;
a plurality of buried contacts and a plurality of landing pads, wherein the plurality of buried contacts fill lower portions of spaces between the plurality of bit line structures on the substrate, and the plurality of landing pads fill upper portions of the spaces between the plurality of bit line structures and extend on the plurality of bit line structures; and
a plurality of storage nodes on the plurality of landing pads,
wherein the plurality of landing pads have a hexagonal array structure, and central points of respective top surfaces of three adjacent landing pads, from among the plurality of landing pads, are connected by a scalene triangle, and
wherein the plurality of storage nodes have a hexagonal array structure, and central points of respective top surfaces of three adjacent storage nodes, from among the plurality of storage nodes, are connected by an equilateral triangle.

12. The semiconductor memory device of claim 11,
wherein the plurality of landing pads are arranged in a line in the first lateral direction and arranged in zigzag in the second lateral direction, and
wherein the plurality of storage nodes are arranged in a line in the first lateral direction and arranged in zigzag in the second lateral direction.

13. The semiconductor memory device of claim 11, wherein a top surface of each of the plurality of landing pads has circular edges.

14. The semiconductor memory device of claim 11, wherein distances among central points of respective top surfaces of three adjacent storage nodes of the plurality of storage nodes have the same value of a reference distance.

15. The semiconductor memory device of claim 14,
wherein a length of a first side of three sides of a triangle connecting the central points of the respective top surfaces of the three adjacent landing pads of the plurality of landing pads is equal to the reference distance, and
wherein a second side and a third side of the three sides of the triangle have a length less than the reference distance and a length greater than the reference distance, respectively.

16. A semiconductor memory device comprising:
a substrate in which a plurality of active regions are defined by a device isolation film;
a plurality of word lines intersecting with the plurality of active regions and extending in parallel in a first lateral direction:
a plurality of bit line structures located on the substrate, the plurality of bit line structures having bit lines extending in parallel in a second lateral direction perpendicular to the first lateral direction;
a plurality of buried contacts filling lower portions of spaces between the plurality of bit line structures on the substrate, the plurality of buried contacts being connected to the plurality of active regions;
a plurality of landing pads connected to the plurality of buried contacts, the plurality of landing pads filling upper portions of the spaces between the plurality of bit line structures and extending onto the plurality of bit line structures, wherein a top surface of each of the plurality of landing pads has a disc shape; and
a plurality of storage nodes located on the plurality of bit line structures and connected to the plurality of landing pads,
wherein first, second, and third sides of a triangle connecting central points of respective top surfaces of three adjacent landing pads, from among the plurality of landing pads, have a length of 3F, a length of less than 3F, and a length of more than 3F, respectively, wherein F represents a feature size, and each of first, second, and third sides of a triangle connecting central points of respective top surfaces of three adjacent storages nodes, from among the plurality of storage nodes, has a length of 3F.

17. The semiconductor memory device of claim 16, wherein the plurality of landing pads are arranged in a line in the first lateral direction and arranged in zigzag in a second lateral direction perpendicular to the first lateral direction to form a hexagonal array structure, and the plurality of storage nodes are arranged in a line in the first lateral direction and arranged in zigzag in the second lateral direction to form a hexagonal array structure.

18. The semiconductor memory device of claim 17, wherein a central extension line extends in the second lateral direction from a center of a side connecting central points of respective top surfaces of first and second landing pads, which are located adjacent to each other in the first lateral direction, from among three adjacent landing pads of the plurality of landing pads, with a central point of a top surface of a third landing pad is located apart from the central extension line in the first lateral direction.

19. The semiconductor memory device of claim 18, wherein the central point of the top surface of the third landing pad is located apart from the central extension line by a distance that is less than half of a distance between central points of respective top surfaces of first and second landing pads, which are adjacent to each other in the first lateral direction, from among the three adjacent landing pads of the plurality of landing pads.

20. The semiconductor memory device of claim 18, wherein the central point of the top surface of the third landing pad is located apart from the central extension line by a distance of 2 nm to 12 nm in the first lateral direction.

* * * * *